United States Patent
Delfosse et al.

(10) Patent No.: US 12,112,240 B2
(45) Date of Patent: Oct. 8, 2024

(54) FAULT CORRECTION FOR CLIFFORD CIRCUITS

(71) Applicant: Microsoft Technology Licensing, LLC, Redmond, WA (US)

(72) Inventors: Nicolas Guillaume Delfosse, Seattle, WA (US); Adam Edward Paetznick, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/820,701

(22) Filed: Aug. 18, 2022

(65) Prior Publication Data

US 2024/0062092 A1     Feb. 22, 2024

Related U.S. Application Data

(60) Provisional application No. 63/369,924, filed on Jul. 29, 2022.

(51) Int. Cl.
G06N 10/70     (2022.01)
H03M 13/00     (2006.01)
H03M 13/15     (2006.01)

(52) U.S. Cl.
CPC .......... *G06N 10/70* (2022.01); *H03M 13/159* (2013.01); *H03M 13/611* (2013.01)

(58) Field of Classification Search
CPC ................ G06N 10/70; H03M 13/159; H03M 13/611
See application file for complete search history.

(56) References Cited

U.S. PATENT DOCUMENTS

| | | |
|---|---|---|
| 9,748,976 B2 | 8/2017 | Naaman et al. |
| 9,762,262 B2 | 9/2017 | Ashikhmin |
| 9,944,520 B2 | 4/2018 | Ashikhmin |
| 10,922,166 B2 | 2/2021 | Hogaboam |
| 11,263,076 B2 | 3/2022 | Nickerson et al. |

(Continued)

FOREIGN PATENT DOCUMENTS

WO     2021143265 A1     7/2021

OTHER PUBLICATIONS

D. Chandra et al., "Quantum Topological Error Correction Codes are Capable of Improving the Performance of Clifford Gates," in IEEE Access, vol. 7, pp. 121501-121529, 2019.*
A. Klappenecker and P. K. Sarvepalli, "Clifford Code Constructions of Operator Quantum Error-Correcting Codes," in IEEE Transactions on Information Theory, vol. 54, No. 12, pp. 5760-5765, Dec. 2008.*
W. Brown and O. Fawzi, "Short random circuits define good quantum error correcting codes," 2013 IEEE International Symposium on Information Theory, Istanbul, Turkey, 2013.*

(Continued)

*Primary Examiner* — Steve N Nguyen
(74) *Attorney, Agent, or Firm* — Alleman Hall & Tuttle LLP

(57) ABSTRACT

A method to correct a fault in application of a Clifford circuit to a qubit register of a quantum computer comprises: (A) receiving circuit data defining the Clifford circuit; (B) emitting outcome code based on the circuit data, the outcome code including a series of outcome checks each corresponding to an anticipated error syndrome of the application of the Clifford circuit to the qubit register; and (C) emitting space-time quantum code corresponding to the Clifford circuit based on the circuit data and on the outcome code, the space-time quantum code including a series of check operators that support quantum-error correction, thereby enabling fault correction in the application of the Clifford circuit to the qubit register.

20 Claims, 9 Drawing Sheets

(56) References Cited

U.S. PATENT DOCUMENTS

| | | | |
|---|---|---|---|
| 11,288,121 B2 | 3/2022 | Katabarwa | |
| 11,321,627 B1* | 5/2022 | Arriola | G06N 10/40 |
| 11,334,693 B1* | 5/2022 | Flammia | G06N 10/70 |
| 11,422,890 B2 | 8/2022 | Fowler | |
| 11,444,636 B2 | 9/2022 | Lucarelli | |
| 11,455,207 B2 | 9/2022 | Chamberland et al. | |
| 11,544,612 B2 | 1/2023 | Ashikhmin | |
| 2014/0118023 A1* | 5/2014 | Eastin | H03K 19/195 |
| | | | 326/7 |
| 2016/0344414 A1* | 11/2016 | Naaman | G06N 10/70 |
| 2019/0042972 A1* | 2/2019 | Zou | G06N 10/00 |
| 2020/0401927 A1* | 12/2020 | Nickerson | G06F 13/36 |
| 2021/0019223 A1* | 1/2021 | Chamberland | G06F 11/1048 |
| 2021/0042652 A1* | 2/2021 | Das | G06N 10/40 |
| 2021/0374586 A1 | 12/2021 | Kliuchnikov et al. | |
| 2022/0215284 A1* | 7/2022 | Jamieson | H03M 13/6597 |
| 2023/0129732 A1* | 4/2023 | Schmitz | G06N 10/20 |
| | | | 714/10 |
| 2024/0056101 A1 | 2/2024 | Delfosse | |

OTHER PUBLICATIONS

Das, et al., "Lilliput: A Lightweight Low-latency Lookup-table based Decoder for Near-term Quantum Error Correction", In Repository of arXiv:2108.06569v1, Aug. 14, 2021, pp. 1-13.

"International Search Report and Written Opinion Issued in PCT Application No. PCT/US2023/025121", dated Oct. 5, 2023, 13 Pages.

"Office Action Issued in U.S. Appl. No. 17/820,687", dated May 15, 2023.

International Search Report and Written Opinion received for PCT Application No. PCT/US2023/025114, Jan. 31, 2024, 14 pages.

Notice of Allowance mailed on Apr. 10, 2024, in U.S. Appl. No. 17/820,687, 7 pages.

Notice of Allowance mailed on Dec. 6, 2023, in U.S. Appl. No. 17/820,687, 8 pages.

Sergey, Bravyi et al., "Improved Classical Simulation of Quantum Circuits Dominated by Clifford Gates", Arxiv.org, Cornell University Library, 201 Olin Library Cornell University Ithaca, NY 14853, Jan. 28, 2016, 20 pages.

\* cited by examiner

Algorithm 1: Construction of the checks of the outcome code of a Clifford circuit.

input : A Clifford circuit $\mathcal{C} = (C_1, \ldots, C_s)$ acting on $n$ qubits.

output: A set $R$ of checks for the circuit $\mathcal{C}$.

78 Set $R = \{\}$ and $\mathcal{S} = \{\}$.
79 for *all $i = 1, \ldots, s$* do
80     if $C_i$ *is a unitary gate* then
81        for *all $T$ in $\mathcal{S}$* do
82           Replace $T$ by $C_i T C_i^{-1}$.
83     if $C_j$ *is the measurement of a Pauli operator $S_j \in \mathcal{P}_n$*. then
84        if $\pm S_j \in \langle \mathcal{S} \rangle$ then
85           Decompose $\pm S_j$ as a product of operators in $\mathcal{S}$.
86           Write this decomposition in the form $\pm S_j = \prod_{k \in K_j} S_k$.
87           if $+S_j \in \langle \mathcal{S} \rangle$ then
88              Add the affine check $o_j + \sum_{k \in K_j} o_k = 0$ to $R$.
89           if $-S_j \in \langle \mathcal{S} \rangle$ then
90              Add the affine check $o_j + \sum_{k \in K_j} o_k = 1$ to $R$.
91        else
92           if *If there exists $T \in \mathcal{S}$ that anti-commutes with $S_j$* then
93              for $T' \in \mathcal{S}$ do
94                  if $T'$ *anti-commute with $S_j$* then
95                     Replace $T'$ by $TT'$ in $\mathcal{S}$.
96              Remove $T$ from $\mathcal{S}$.
97           Add $S_j$ to $\mathcal{S}$.
98 return $R$.

*FIG. 7*

Algorithm 2: Construction of generators for a stabilizer group induced on a subset of qubits.

input : A set of stabilizer generators $S = \{S_1, \ldots, S_r\}$ and logical operators $\bar{X}_1, \bar{Z}_1, \ldots, \bar{X}_k, \bar{Z}_k$ for a stabilizer code with length $n$.

output: A generating set for the restriction of $(S)$ to a subset $A \subset \{1, \ldots, n\}$.

100 Construct a Pauli matrix G whose rows are the restricted operators of the form $S_{1|A}, \ldots, S_{r|A}, \bar{X}_{1|A}, \bar{Z}_{1|A}, \ldots, \bar{X}_{k|A}, \bar{Z}_{k|A}$.

101 Remove the rows of $A^C$ and the trivial rows of G.

102 Put G in standard form (using the standard form of [Ref. 3]).

103 Using the standard form of G, construct a Pauli matrix H whose rows satisfy $[\mathbf{H}_i, \mathbf{G}_j] = \delta_{i,j}$.

104 Construct a Pauli matrix S' whose rows are the $2|A|$ operators $X_i, Z_i$, with $i \in A$.

105 for *each row $S'_i$ of $\mathbf{S}$* do

106   for *each row $H_j$ for $\mathbf{H}$* do

107     if $[S'_i, G_j] = 1$ then

108       Multiply row $S'_i$ of S' by $H_j$.

109 return *the rows of $\mathbf{S'}$*.

FIG. 8

Algorithm 3: Construction of low weight stabilizers of a space-time code.

input : A Clifford circuit $\mathcal{C}$. An integer $R$.

output: A set containing all the connected stabilizers of the space-time code of $\mathcal{C}$ with weight $\leq M$.

110   Set $\mathcal{S}_M = \{\}$.

111   Construct a set of generators $\{u_1, \ldots, u_r\}$ of the code $\mathcal{O}(\mathcal{C})^\perp$ using Algorithm 1.

112   Construct the set $\mathcal{S}$ of stabilizer generators $S_i = \overleftarrow{F}(u_i)$ of the space-time code.

113   Construct a set of logical operators $\bar{X}_1, \bar{Z}_1, \ldots, \bar{X}_K, \bar{Z}_K$ of the space-time code.

114   Construct the space-time graph $G = (V, E)$ of $\mathcal{C}$.

115   for *all vertices $v \in V$* do

116      Let $A$ be the set of vertices of $G$ at distance $\leq \lfloor M/2 \rfloor$ from $v$.

117      Compute a set $\mathcal{S}(A)$ of generators of the restriction of the stabilizer group $\langle \mathcal{S} \rangle$ to $A$ using Algorithm 2.

118      for *all vectors $F$ of $\langle \mathcal{S}(A) \rangle$ with weight $|F| \leq R$* do

119          Compute the connected components of the support of $F$.

120          If the support of $F$ has a single connected component, add $F$ to $\mathcal{S}_M$.

121   return $\mathcal{S}_M$.

*FIG. 9*

FAULT CORRECTION FOR CLIFFORD CIRCUITS

CROSS REFERENCE TO RELATED APPLICATIONS

This application claims priority to U.S. Provisional Patent Application Ser. No. 63/369,924, filed Jul. 29, 2022, the entirety of which is hereby incorporated herein by reference for all purposes.

BACKGROUND

A quantum computer is a physical machine configured to execute logical operations based on or influenced by quantum-mechanical phenomena. Such logical operations may include, for example, mathematical computation. Current interest in quantum-computer technology is motivated by analysis suggesting that the computational efficiency of an appropriately configured quantum computer may surpass that of any practicable non-quantum computer when applied to certain types of problems. Such problems include computer modeling of natural and synthetic quantum systems, integer factorization, data searching, and function optimization as applied to systems of linear equations and machine learning.

SUMMARY

One aspect of this disclosure relates to a method to correct a fault in application of a Clifford circuit to a qubit register of a quantum computer. The method comprises: (A) receiving circuit data defining the Clifford circuit; (B) emitting outcome code based on the circuit data, the outcome code including a series of outcome checks each corresponding to an anticipated error syndrome of the application of the Clifford circuit to the qubit register; and (C) emitting space-time quantum code corresponding to the Clifford circuit based on the circuit data and on the outcome code, the space-time quantum code including a series of check operators that support quantum-error correction, thereby enabling fault correction in the application of the Clifford circuit to the qubit register.

Another aspect of this disclosure relates to a computer system coupled operatively to a quantum computer. The computer system comprises a processor and, operatively coupled to the processor, computer memory holding instructions that cause the processor to correct a fault in application of a Clifford circuit to a qubit register of the quantum computer. The instructions comprise: instructions (A) for receiving circuit data defining the Clifford circuit; instructions (B) for emitting outcome code based on the circuit data, the outcome code including a series of outcome checks each corresponding to an anticipated error syndrome of the application of the Clifford circuit to the qubit register; and instructions (C) for emitting space-time quantum code corresponding to the Clifford circuit based on the circuit data and the outcome code, the space-time quantum code including a series of check operators that support quantum-error correction, thereby enabling fault correction in the application of the Clifford circuit to the qubit register.

This Summary is provided to introduce in simplified form a selection of concepts that are further described in the Detailed Description. This Summary is not intended to identify key features or essential features of the claimed subject matter, nor is it intended to be used to limit the scope of the claimed subject matter. The claimed subject matter is not limited to implementations that solve any or all disadvantages noted in any part of this disclosure.

BRIEF DESCRIPTION OF THE DRAWINGS

FIG. 7 shows aspects of an example algorithm for construction of the checks of the outcome code of a Clifford circuit.

FIG. 8 shows aspects of an example algorithm for construction of generators for a stabilizer group induced on a subset of qubits.

FIG. 9 shows aspects of an example algorithm for construction of low weight stabilizers of a space-time code.

DETAILED DESCRIPTION

1. Overview of Circuit-Fault Correction

Disclosed is a scheme for correction of faults in Clifford circuits, which applies not only to quantum error-correction circuits but to any Clifford circuit including redundant measurements. The construction relies on the observation that the set of all possible outcome bit-strings of a Clifford circuit is a linear code and therefore can be used to detect and correct faults in the circuit. Exploiting this property, the problem of correcting circuit faults is reduced to the correction of Pauli errors with a stabilizer code, which herein is called the space-time code of the circuit. To build the space-time code of the circuit, the circuit-to-code construction of Bacon, Flammia, Harrow and Shi [Ref. 1] is revisited and extended to include intermediate measurements and multi-qubit measurements.

This formalism is used to automate the construction of a full set of checks for detection and correction of circuit faults. Combined with a lookup decoder, this leads to a circuit-fault decoder exploiting all the redundancy available in the circuit. To go beyond the regime of the lookup decoder, which is only practical for small circuits, an algorithm is proposed for generating low-weight checks, which can be combined with efficient LDPC code decoders.

2. Quantum-Computer Architecture

Figure 1:
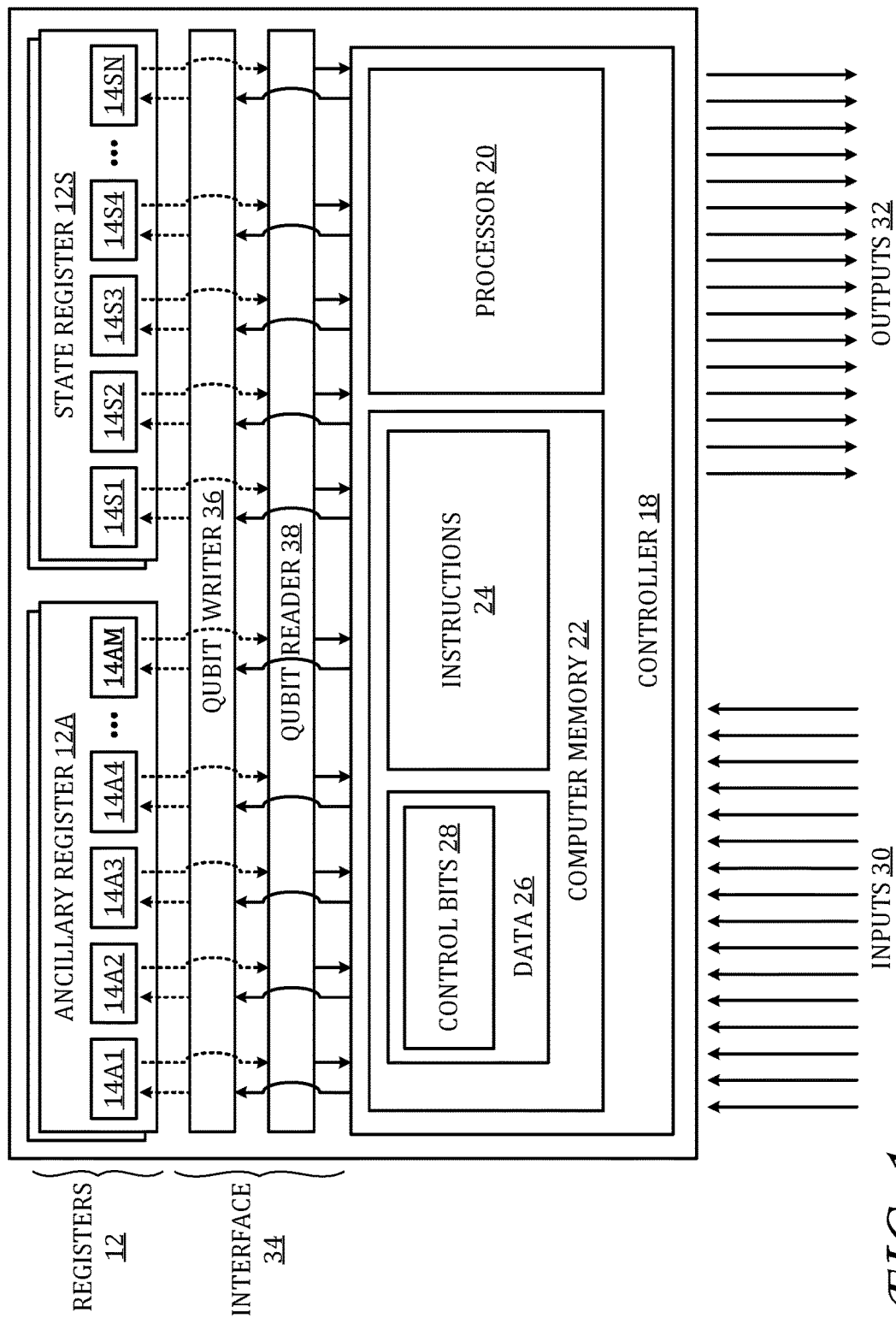
FIG. 1 shows aspects of an example quantum computer.

In order to provide a context for circuit-fault correction, some aspects of an example quantum-computer architecture will first be described. Turning now to the drawings, FIG. 1 shows aspects of an example quantum computer 10 configured to execute quantum-logic operations (vide infra). Whereas conventional computer memory holds digital data in an array of bits and enacts bit-wise logic operations, a quantum computer holds data in an array of qubits and operates quantum-mechanically on the qubits in order to implement the desired logic. Accordingly, quantum computer 10 of FIG. 1 includes a set of qubit registers 12—e.g., state register 12S and ancillary register 12A. Each qubit register includes a series of qubits 14. The number of qubits in a qubit register is not particularly limited but may be determined based on the complexity of the quantum logic to be enacted by the quantum computer.

Qubits 14 of qubit register 12 may take various forms, depending on the desired architecture of quantum computer 10. Each qubit may comprise: a superconducting Josephson junction, a trapped ion, a trapped atom coupled to a high-finesse cavity, an atom or molecule confined within a fullerene, an ion or neutral dopant atom confined within a host lattice, a quantum dot exhibiting discrete spatial- or spin-electronic states, electron holes in semiconductor junctions entrained via an electrostatic trap, a coupled quantum-wire pair, an atomic nucleus addressable by magnetic resonance, a free electron in helium, a molecular magnet, or a metal-like carbon nanosphere, as non-limiting examples. A qubit may be implemented in the plural processing states corresponding to different modes of light propagation through linear optical elements (e.g., mirrors, beam splitters and phase shifters), as well as in states accumulated within a Bose-Einstein condensate. More generally, each qubit 14 may comprise any particle or system of particles that can exist in two or more discrete quantum states that can be measured and manipulated experimentally.

Figure 2:
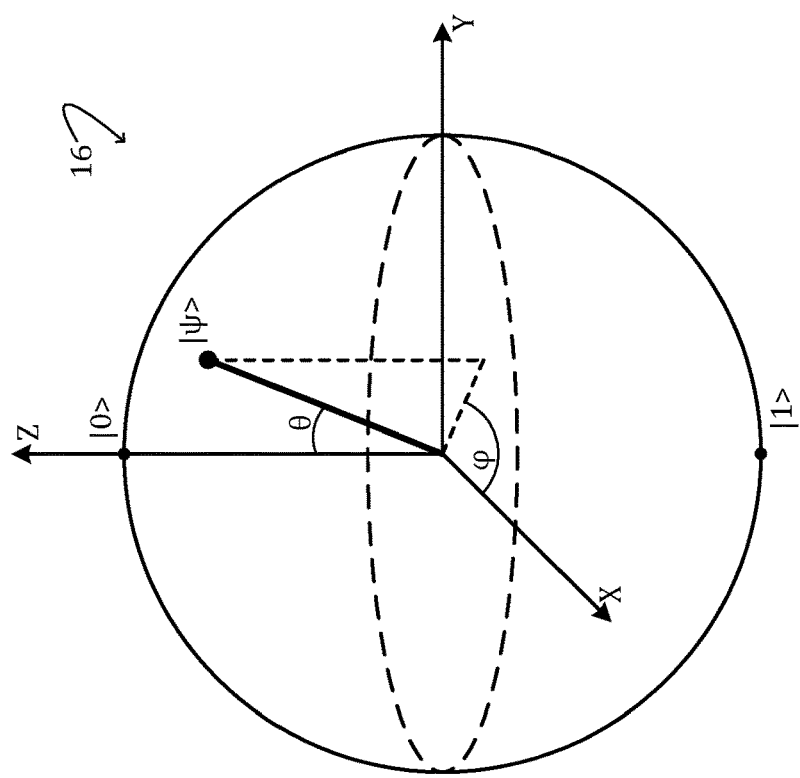
FIG. 2 illustrates a Bloch sphere, which graphically represents the quantum state of one qubit of a quantum computer.

FIG. 2 is an illustration of a Bloch sphere 16, which provides a graphical description of some quantum mechanical aspects of an individual qubit 14. In this description, the north and south poles of the Bloch sphere correspond to the standard basis vectors $|0\rangle$ and $|1\rangle$, respectively—up and down spin states, for example, of an electron or other fermion. The set of points on the surface of the Bloch sphere comprise all possible pure states $|\psi\rangle$ of the qubit, while the interior points correspond to all possible mixed states. A mixed state of a given qubit may result from decoherence, which may occur because of undesirable coupling to external degrees of freedom.

Returning now to FIG. 1, quantum computer 10 includes a controller 18. The controller may include at least one processor 20 and associated computer memory 22. Processor 20 may be coupled operatively to peripheral componentry, such as network componentry, to enable the quantum computer to be operated remotely. Processor 20 may take the form of a central processing unit (CPU), a graphics processing unit (GPU), or the like. As such, controller 18 may comprise classical electronic componentry. The terms 'classical' and 'non-quantum' are applied herein to any component that can be modeled accurately without considering the quantum state of any individual particle therein. Classical electronic components include integrated, microlithographed transistors, resistors, and capacitors, for example. Computer memory 22 may be configured to hold program instructions 24 that cause processor 20 to execute any function or process of controller 18. The computer memory may also be configured to hold additional data 26. In some examples, data 26 may include a register of classical control bits 28 that influence the operation of the quantum computer during run time—e.g., to provide classical control input to one or more quantum-gate operations. In examples in which qubit register 12 is a low-temperature or cryogenic device, controller 18 may include control componentry operable at low or cryogenic temperatures—e.g., a field-programmable gate array (FPGA) operated at 77K. In such examples, the low-temperature control componentry may be coupled operatively to interface componentry operable at normal temperatures.

Controller 18 of quantum computer 10 is configured to receive a plurality of inputs 30 and to provide a plurality of outputs 32. The inputs and outputs may each comprise digital and/or analog lines. At least some of the inputs and outputs may be data lines through which data is provided to and/or extracted from the quantum computer. Other inputs may comprise control lines via which the operation of the quantum computer may be adjusted or otherwise controlled.

Controller 18 is operatively coupled to qubit registers 12 via quantum interface 34. The quantum interface is configured to exchange data (solid lines) bidirectionally with the controller. The quantum interface is further configured to exchange signal associated with the data (dashed lines) bidirectionally with the qubit registers. Depending on the physical implementation of qubits 14, such signal may include electrical, magnetic, and/or optical signal. Via signal conveyed through the quantum interface, the controller may interrogate and otherwise influence the quantum state held in any, some, or all of the qubit registers, as defined by the collective quantum state of the qubits therein. To that end, the quantum interface includes qubit writer 36 and qubit reader 38. The qubit writer is configured to output a signal to one or more qubits of a qubit register based on write-data received from the controller. The qubit reader is configured to sense a signal from one or more qubits of a qubit register and to output read-data to the controller based on the signal. The read-data received from the qubit reader may, in some examples, be an estimate of an observable to the measurement of the quantum state held in a qubit register. Taken together, controller 18 and interface 34 may be referred to as a 'controller system'.

In some examples, suitably configured signal from qubit writer 36 may interact physically with one or more qubits 14 of a qubit register 12, to trigger measurement of the quantum state held in the one or more qubits. Qubit reader 38 may then sense a resulting signal released by the one or more qubits pursuant to the measurement, and may furnish read-data corresponding to the resulting signal to controller 18. Stated another way, the qubit reader may be configured to output, based on the signal received, an estimate of one or more observables reflecting the quantum state of one or more qubits of a qubit register, and to furnish the estimate to controller 18. In one non-limiting example, the qubit writer may provide, based on data from the controller, an appropriate voltage pulse or pulse train to an electrode of one or more qubits, to initiate a measurement. In short order, the qubit reader may sense photon emission from the one or more qubits and may assert a corresponding digital voltage level on a quantum-interface line into the controller. Generally speaking, any measurement of a quantum-mechanical state is defined by the operator O corresponding to the observable to be measured; the result R of the measurement is guaranteed to be one of the allowed eigenvalues of O. In quantum computer 10, R is statistically related to the qubit-register state prior to the measurement, but is not uniquely determined by the qubit-register state.

Pursuant to appropriate input from controller 18, quantum interface 34 may be configured to implement one or more quantum-logic gates to operate on the quantum state held in a qubit register 12. The term 'state vector' refers herein to the quantum state held in the series of qubits 14S of state register 12S of quantum computer 10. The state vector is a convenient representation that may be used to interpret measurement outcomes. Whereas the function of each type of logic gate of a classical computer system is described according to a corresponding truth table, the function of each type of quantum gate is described by a corresponding operator matrix. The operator matrix operates on (i.e., multiplies) the complex vector representing a qubit register state and effects a specified rotation of that vector in Hilbert space.

For example, the Hadamard gate H is defined by $$H = \frac{1}{\sqrt{2}}\begin{bmatrix} 1 & 1 \\ 1 & -1 \end{bmatrix}. \quad (1)$$

The H gate acts on a single qubit; it maps the basis state $|0\rangle$ to $(|0\rangle+|1\rangle)/\sqrt{2}$, and maps $|1\rangle$ to $(|0\rangle-|1\rangle)/\sqrt{2}$. Accordingly, the H gate creates a superposition of states that, when measured, have equal probability of revealing $|0\rangle$ or $|1\rangle$.

The phase gate S is defined by $$S = \begin{bmatrix} 1 & 0 \\ 0 & e^{i\pi/2} \end{bmatrix}. \quad (2)$$

The S gate leaves the basis state $|0\rangle$ unchanged but maps $|1\rangle$ to $e^{i\pi/2}|1\rangle$. Accordingly, the probability of measuring either $|0\rangle$ or $|1\rangle$ is unchanged by this gate, but the phase of the quantum state of the qubit is shifted. This is equivalent to rotating ψ by 90 degrees along a circle of latitude on the Bloch sphere of FIG. 2.

Some quantum gates operate on two or more qubits. The SWAP gate, for example, acts on two distinct qubits and swaps their values. This gate is defined by $$SWAP = \begin{bmatrix} 1 & 0 & 0 & 0 \\ 0 & 0 & 1 & 0 \\ 0 & 1 & 0 & 0 \\ 0 & 0 & 0 & 1 \end{bmatrix}. \quad (3)$$

A 'Clifford gate' is a quantum gate that belongs to the Clifford group—viz., a set of quantum gates that effect permutations of the Pauli operators. For the n-qubit case the Pauli operators form a group $$P_n = \{e^{i\theta\pi/2}\sigma_{j_1} \otimes \ldots \otimes \sigma_{j_n} | \theta=0,1,2,3, j_k=0,1,2,3\}, \quad (4)$$

where $\sigma_0, \ldots \sigma_3$ are the single-qubit Pauli matrices. The Clifford group is then defined as the group of unitaries that normalize the Pauli group, $$C_n = \{V \in U_{2^n} | VP_nV^\dagger = P_n\}. \quad (5)$$

The foregoing list of quantum gates and associated operator matrices is non-exhaustive, but is provided for ease of illustration. Other quantum gates include Pauli –X, –Y, and –Z gates, the $\sqrt{NOT}$ gate, additional phase-shift gates, the $\sqrt{SWAP}$ gate, controlled cX, cY, and cZ gates, and the Toffoli, Fredkin, Ising, and Deutsch gates, as non-limiting examples.

Figure 3:
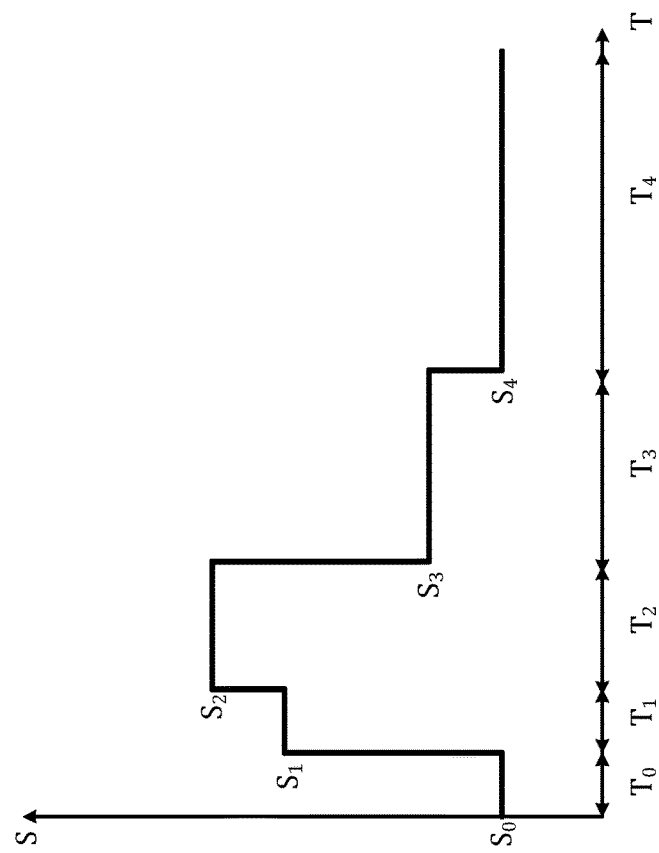
FIG. 3 shows aspects of an example signal waveform for effecting a quantum-gate operation in a quantum computer.

Continuing in FIG. 1, suitably configured signal from qubit writer 36 of quantum interface 34 may interact physically with one or more qubits 14 of a qubit register 12 so as to assert any desired quantum-gate operation. As noted above, the desired quantum-gate operations include specifically defined rotations of a complex vector representing a qubit register state. In some examples, in order to effect a desired rotation O, the qubit writer may apply a predetermined signal level $S_i$ for a predetermined duration $T_i$. In some examples, plural signal levels may be applied for plural sequenced or otherwise associated durations, as shown in FIG. 3, to assert a quantum-gate operation on one or more qubits of a qubit register. In general, each signal level $S_i$ and each duration $T_i$ is a control parameter adjustable by appropriate programming of controller 18.

The terms 'oracle' and 'quantum algorithm' are used herein to describe a predetermined sequence of elementary quantum-gate and/or measurement operations executable by quantum computer 10. An oracle may be used to transform the quantum state of a qubit register 12 to effect a classical or non-elementary quantum-gate operation or to apply a density operator, for example. In some examples, an oracle may be used to enact a predefined 'black-box' operation f(x), which may be incorporated into a complex sequence of operations. To ensure adjoint operation, an oracle mapping n input qubits $|x\rangle$ to m output or ancilla qubits $|y=f(x)\rangle$ may be defined as a quantum gate $O(|x\rangle \otimes |y\rangle)$ operating on the (n+m) qubits. In this case, O may be configured to pass the n input qubits unchanged but combine the result of the operation f(x) with the ancillary qubits via an XOR operation, such that $O(|x\rangle \otimes |y\rangle) = |x\rangle \otimes |y \oplus f(x)\rangle$.

Implicit in the description herein is that each qubit 14 of any qubit register 12 may be interrogated via quantum interface 34 so as to reveal with confidence the standard basis vector $|0\rangle$ or $|1\rangle$ that characterizes the quantum state of that qubit. In some implementations, however, measurement of the quantum state of a physical qubit may be subject to error. Accordingly, any qubit 14 may be implemented as a logical qubit, which includes a grouping of physical qubits measured according to an error-correcting oracle that reveals the quantum state of the logical qubit with above-threshold confidence.

3. Introduction to Circuit-Fault Correction

Several small quantum computing platforms are available today. However, the high noise rate of quantum hardware is a major obstacle to the scalability. Some form of quantum error correction is desirable to achieve a noise rate sufficiently low to run quantum algorithms capable of solving large-scale industrial problems.

Disclosed herein is a method for correction of faults in Clifford circuits. These circuits are used, inter alia, to implement standard protocols such as quantum teleportation, preparation of Bell states, and quantum error correction with stabilizer codes. Even though they are not universal for quantum computing one can achieve universality with Clifford circuit by injection of magic states [Ref. 2].

Considered herein are circuits made with unitary Clifford gates and Pauli measurements. Not only single-qubit measurements, but all Pauli measurements are permitted, as well as internal measurements that can occur at any time step of the circuit.

Each run of a Clifford circuit produces a classical bit-string. The basic idea is to correct circuit faults using the redundancy in these bit-strings. It is proved that the set of all possible outcome bit-strings of a Clifford circuit is a linear code (up to relabeling the measurement outcomes). An algorithm is disclosed that returns a complete set of checks for this linear code.

One can directly use this outcome code to detect and correct circuit faults. However, this requires construction of a decoder, which is generally a non-trivial task. Instead of constructing a new decoder that maps check values onto circuit faults, the approach herein is to construct a stabilizer code associated with a Clifford circuit, the space-time code, with the property that the measurement of the stabilizer generators of the space-time code returns the value of the checks of the outcome code. It is then shown that one can design a circuit decoder that returns a most likely fault configuration using a most likely error decoder for the space-time stabilizer code.

The space-time code used in this disclosure is related to the circuit-to-code construction of Bacon, Flammia, Harrow and Shi [Ref. 1]. In this reference, the authors proposed a construction of subsystem codes from a class of Clifford circuits with the goal of building new subsystem codes. They considered a subclass of post-selection circuits and computed the parameters of the subsystem code as a function of the input circuit. The space-time code considered in the present work can be seen as the stabilizer code associated with the subsystem code of [Ref. 1] after generalizing their construction to arbitrary Clifford circuits. More specifically, multi-qubit Pauli measurements are added, and measurements are permitted at any time-step of the circuit.

This disclosure provides alternative proofs of the properties of the space-time code based on the relation between the forward and the backward propagation of the faults through the circuit. In particular, it is proved that the backpropagation operator is the adjoint of the propagation operator. This relation could be relevant for other applications also.

Based on reduction of the problem of circuit-fault correction to construction of a decoder for the space-time code, one can build a scheme for the correction of any small Clifford circuit using a lookup decoder. Even though the construction of a lookup decoder can be optimized [Ref. 3], it is limited to small system sizes. To expand the range of application of this scheme, an algorithm to produce a set of low-weight stabilizer generators for the space-time code is proposed, which results in a low-density parity-check (LDPC) space-time code, for which efficient decoders exist [Ref. 4], [Ref. 5], [Ref. 6], [Ref. 7]. Starting from a local code in D dimensions the algorithm produces local stabilizer generators in D+1 dimensions for the space-time code, and topological code decoders such as the renormalization-group decoder [Ref. 8] may then be used.

The fault-correction scheme herein applies to any Clifford circuit, but the case of a syndrome extraction circuit of a quantum error-correction code is of special interest. The design of a quantum error-correction scheme is a non-trivial task which requires (i) a syndrome extraction circuit, (ii) a syndrome map, (iii) a decoder. Based on this disclosure the construction of the syndrome map and the decoder can be automated in some cases. No performance guarantee for the resulting scheme is provided, and it is believed that some specialized schemes, highly optimized for a specific circuit, are likely to perform better. The main advantage of the approach here is its flexibility. This approach only requires the circuit to be given as an input and it applies to codes implemented with Clifford operations or Pauli measurements. This includes for instance CNOT-based surface codes [Ref. 9], [Ref. 10] or color codes [Ref. 11], Majorana-based surface codes [Ref. 12] or Floquet codes [Ref. 13] that are implemented with only joint measurements.

Figure 4:
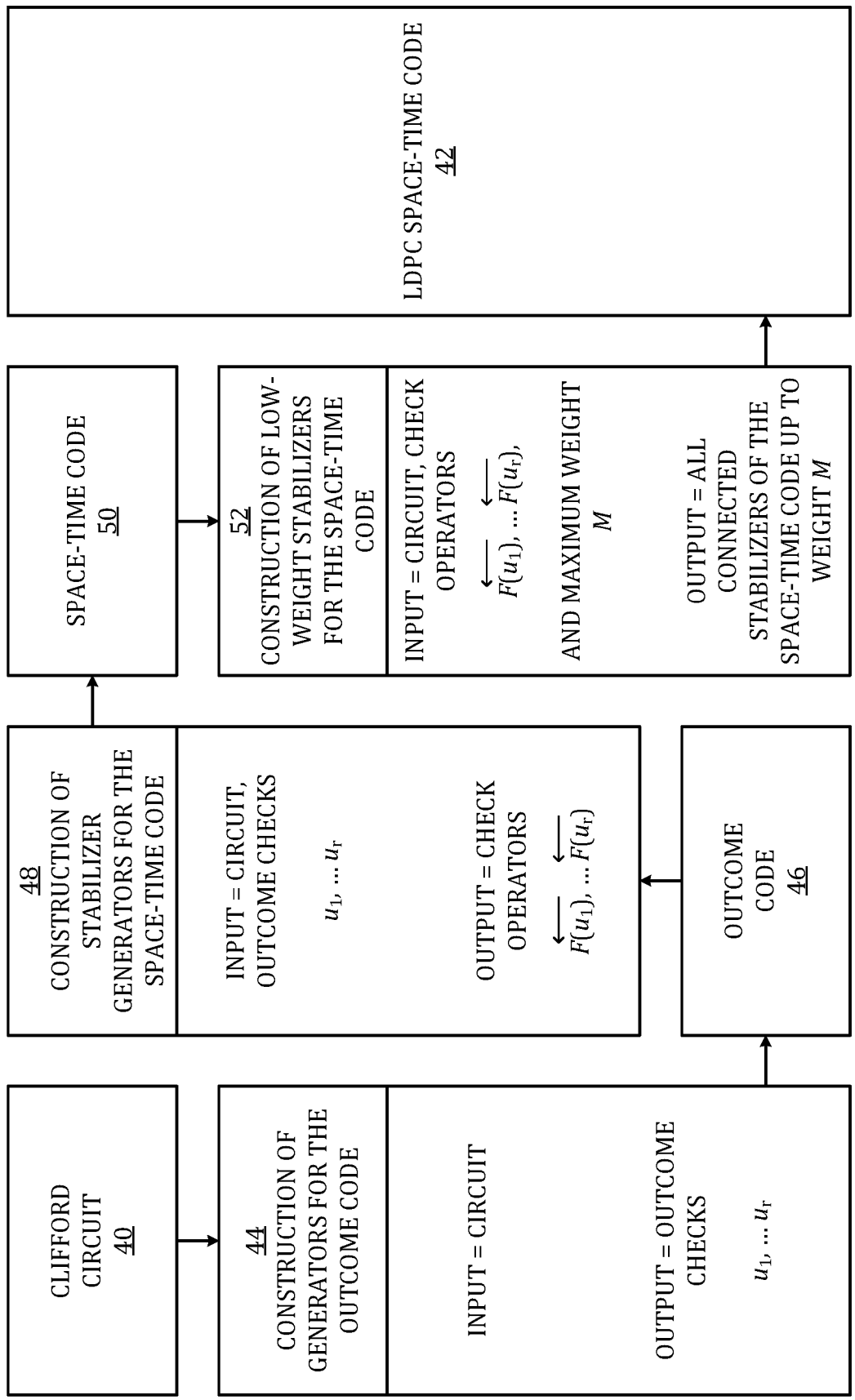
FIG. 4 shows aspects of reduction of the problem of correcting faults in a Clifford Circuit to the decoding of a quantum LDPC code.

FIG. 4 shows aspects of the reduction of the problem of correcting faults in a Clifford circuit 40 to the decoding of a quantum LDPC code 42. The LDPC code produced can be decoded using any quantum LDPC-code decoder, thereby providing an end-to-end strategy for the correction of faults in the Clifford circuit given only the circuit as an input. The first step 44 which produces the outcome code 46 is described in Algorithm 1. Section 8 explains the construction 48 of the space-time code 50 from the outcome code.

The low-weight generators of the space-time code are obtained using Algorithm 3. Finally the LDPC space-time code is emitted via construction, at 52, of low-weight stabilizers for the space-time code. The whole procedure runs in polynomial time. This procedure results in a trivial LDPC space-time code if the input circuit has no redundancy or if the space-time code has no generator with weight≤M. In Section 9, sufficient conditions for the existence of low-weight generators for the space-time code of a circuit are provided.

The balance of this disclosure is organized as follows. Technical context is introduced in Section 4. Then, Section 5 proves some core technical results and establishes the relation between the propagation and the backpropagation operators. The outcome code is defined in Section 6 which also describes an algorithm (Algorithm 1) to compute a complete set of checks for this code. The stabilizer generators of the space-time code are introduced in Section 7 and Section 8 proves that a most-likely error decoder for the space-time code can be converted into a circuit decoder that returns a most likely set of faults (Theorem 2). Section 9 provides an algorithm (Algorithm 3) to generate low-weight stabilizer for the space-time code. Finally, in Section 10, the solution is integrated and the implementation of an automated scheme for the correction of circuit faults in Clifford circuits is discussed.

4. Technical Context

4.1. Linear Codes

A linear code with length n is a $\mathbb{Z}_2$-linear subspace of $\mathbb{Z}_2^n$. It encodes k bits into n bits where k is the dimension of the code.

The dual code of a linear code C with length n, denoted $C^\perp$, is the set of vectors of $\mathbb{Z}_2^n$ that are orthogonal with all the vectors of C. In this context, the term 'orthogonal' means orthogonal for the binary inner product $(u|v) = \sum_{i=1}^n u_i v_i$ (mod 2). In some instances the vectors of the dual codes are referred to as the check of the code because the code is fully defined the relations $(u_i|v) = 0$ where $u_i$ runs over a basis for the dual code.

One can define a linear code by providing a set of generators of the code or by providing a set of generators of the dual code. Given a set of generators of the dual code $u_1, \ldots, u_r \in \mathbb{Z}_2^n$, the code is the set of vectors $v \in \mathbb{Z}_2^n$ that satisfy $(u_i|v) = 0$ for all $i = 1, \ldots, r$. Vectors $u_i$ are referred to as the checks of the code.

The syndrome map associated with the checks $u_1, \ldots, u_r \in \mathbb{Z}_2^n$ is the map $$\sigma: \mathbb{Z}_2^n \rightarrow \mathbb{Z}_2^r \qquad (6)$$

that sends a vector v onto the vector s whose i th component is $s_i = (u_i|v)$. The vector s is called the syndrome of u. The value of the syndrome of a vector can be used to correct some bit flips affecting this vector and to map it back to the code space.

4.2. Stabilizer Codes

A stabilizer code with length n is defined by a set of commuting n-qubit Pauli operators $\mathcal{S}$, called stabilizer generators, such that the group $\langle \mathcal{S} \rangle$ they generate does not contain −I. The group $\langle \mathcal{S} \rangle$ is referred to as the stabilizer group of the code, and a Pauli operator P such that $\pm P \in \langle \mathcal{S} \rangle$ is called a stabilizer.

The code space of a stabilizer code with length n is the subspace of $(\mathbb{C}_2)^{\otimes n}$ that is invariant under the stabilizer generators. If stab contains r independent operators, the code space is a subspace of $(\mathbb{C}_2)^{\otimes n}$ isomorphic with $(\mathbb{C}_2)^{\otimes n-r}$. This subspace is interpreted as the encoding of k=n−r qubits into n qubits.

Error correction with a stabilizer code is based on the measurement of a set of stabilizer generators $\mathcal{S}=\{S_1, \ldots, S_r\}$. This produces an outcome $\sigma \in \mathbb{Z}_2^r$ called the syndrome. Here the outcome $\sigma_i$ corresponds to the eigenvalue $(-1)^{\sigma_i}$ for the i th measured stabilizer generator. If the state of the system before syndrome measurement is a code state suffering from Pauli error $E \in \overline{\mathcal{P}}_n$, then the measurement returns a syndrome $\sigma$ such that $\sigma_i=[E,S_i]$ where $[E,S_i]$ is 0 if E and $S_i$ commute and 1 otherwise. In the absence of error, the syndrome is trivial. Therefore, a non-trivial syndrome can be used to detect and correct errors on encoded states.

In what follows, $\mathcal{P}_n$ denotes the set of n-qubit Pauli operators and $\overline{\mathcal{P}}_n$ is its quotient by the phase operators $\{\pm I, \pm iI\}$. In other words, considered in $\overline{\mathcal{P}}_n$ are the Pauli operators up to a phase. It is natural to consider Pauli errors up to a phase because a global phase has no effect on quantum states.

Provided is a Pauli noise model which prescribes the probability of each Pauli error. A most likely error decoder (MLE decoder) is a map $\mathbb{Z}_2^r \mapsto \overline{\mathcal{P}}_n$ that sends a syndrome $\sigma$ onto a Pauli error E which has maximum probability among the error with syndrome $\sigma$.

A logical operator for a stabilizer code with length n is a Pauli operator that commutes with all the stabilizer generators of the code. It is a non-trivial logical operator if in addition it is not a stabilizer.

In what follows, for any subset A of $\overline{\mathcal{P}}_n$, $$A^{\perp}=\{Q \in \overline{\mathcal{P}}_n | \forall P \in A, [P,Q]=0\} \quad (7)$$

for the set of n-qubit Pauli operators that commute with all the elements of A. If $\langle \mathcal{S} \rangle$ is a stabilizer group, then $\mathcal{S}^{\perp}$ is the set of logical operators and $\mathcal{S}^{\perp} \backslash \langle \mathcal{S} \rangle$ is the set of non-trivial logical operators of the code.

4.3. Clifford Circuits

This disclosure considers circuits made with the following operations: (a) unitary Clifford gate, and (b) Pauli measurements. One can use these operations to prepare a qubit in the state $|0\rangle$ using a measurement Z. It is assumed that all the qubits are present at the beginning of the circuit and that no qubit can be added through the circuit. This is not a restriction because a qubit can be reinitialized using a single qubit measurement as explained above. No restriction is placed on the size of the support of allowed operations, but the results also apply to circuits limited to single-qubit and two-qubit gates or circuit respecting a given qubit connectivity where only operations acting on neighboring qubits are available.

A Clifford circuit is a sequence of s Clifford operations $\mathcal{C} = (C_1, \ldots, C_s)$ applied to n qubits. Each operation $C_i$ is applied at a given time step level$(C_i) \in \{1, 2, \ldots\}$ called the level of the operation. The depth of a circuit, denoted $\Delta(\mathcal{C})$, is the maximum level of its operations. To guarantee that they can be implemented simultaneously, it is required that two operations with the same level have disjoint support. In what follows, it is assumed that the circuit operations are given in chronological order, that is i≤j implies level$(C_i) \leq$ level$(C_j)$.

The state of the n qubits of the circuit before the first circuit operation is referred to as the input state of the circuit and the final state of the n qubits is the output state of the circuit. No constraint is placed on the input state of the circuit.

Throughout this disclosure, m denotes the number of Pauli measurements in the circuit and $S_1, \ldots, S_m$ denotes the measured operators. For all j=1, ..., m, the level of the measurement $S_j$ is denoted $\ell_j$. By definition, 0≤m≤s, and each $\ell_j$ is an integer in the set $\{1, \ldots, \Delta\}$.

4.4. Circuit Faults

The standard circuit noise model is considered, where each circuit operation $C_i$ and each waiting qubit is faulty with probability $p_i$. If a unitary gate or a waiting qubit is faulty, it is followed by a uniform random Pauli error E acting on its support. A faulty measurement is followed by a uniform random Pauli error E acting on its support combined with a flip of the measurement outcome with probability 1/2.

Figure 5A:
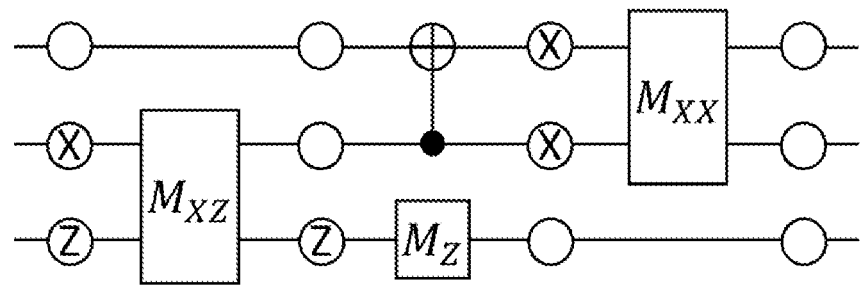
FIG. 5A and FIG. 5B show aspects of a circuit with depth three made with Pauli measurements and unitary Clifford gates.
Figure 5B:
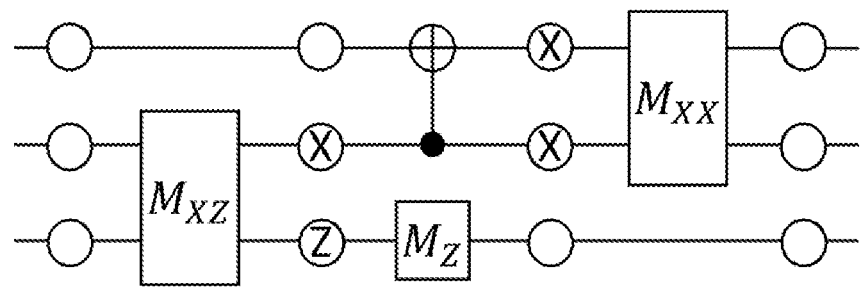

In light of [Ref. 1], it is convenient to represent faults as Pauli operators acting on half-integer time steps as shown in FIG. 5A and FIG. 5B (vide infra). A fault operator for a circuit $\mathcal{C}$ acting on n qubits with depth $\Delta$ is a Pauli operator $F \in \overline{\mathcal{P}}_{n(\Delta+1)}$ acting on $n(\Delta+1)$ qubits indexed by pairs ($\ell +0.5,q$) where $\ell \in \{0, 1, \ldots, \Delta\}$ represents a level of the circuit and $q \in \{1, \ldots, n\}$ corresponds to a qubit. $\ell = 0$ is included to represent faults on the input qubits of the circuit. The component of F on qubit ($\ell +0.5,q$) is denoted $F_{\ell +0.5,q} \in \{I, X, Y, Z\}$. It corresponds to the fault occurring right after level $\ell$ on qubit q. The notation $F\ell_{+0.5}$ is used for the n-qubit Pauli operator $\otimes_{q=1}^n F_{\ell+0.5,q}$, which represents the fault occurring right after the level $\ell$ of the circuit.

The flip of a measurement outcome can also be represented as a fault operator. Let $P \in \overline{\mathcal{P}}_n$ be a measured Pauli operator and let $Q \in \overline{\mathcal{P}}_n$ be a weight-one operator Q that anti-commutes with P. Then, the fault operator F such that $F_{\ell-0.5}=Q$ and $F_{\ell+0.5}=Q$ is a representation of the flip of the outcome of the measurement of P at level $\ell$.

Throughout this disclosure, it is assumed that a noise model is provided, which describes the probability of each combination of circuit faults. The corresponding probability distribution over the set of fault operators is denoted by $\mathbb{P}_\mathcal{F}$.

4.5. Propagation of Pauli Faults

The effect of a set of faults on the outcomes of a circuit can be determined by propagating the faults through the circuit as shown.

FIG. 5A and FIG. 5B show aspects of a circuit with depth three made with Pauli measurements and unitary Clifford gates. Pauli faults are supported on the white circles. More specifically, a fault operator is shown in FIG. 5A and its backpropagation in FIG. 5B. In this circuit, the third measurement is redundant and the three measurement outcomes $o_1, o_2, o_3$ satisfy $o_1+o_2+o_3=0$ (mod 2). This defines a check of the outcome code. The stabilizer generator of the space-time code corresponding to this check is obtained by the backpropagation of the three measurements through the circuit. This results in the weight-four Pauli operator shown in FIG. 5B supported on the circles.

The basic idea of fault propagation is that a Pauli fault P∈ $\overline{\mathcal{P}}_n$ occurring before a unitary operation U is equivalent to a fault UPU$^{-1}$ after the operation g. UPU$^{-1}$ refers to the conjugation of P by U. In the case of a Pauli measurement, a fault propagates through the corresponding projector unchanged, and it leads to a flip of the measurement outcome if the Pauli fault preceding the measurement anticommutes with the measured operator.

The propagation of a fault operator F through a circuit $\mathcal{C}$ with depth Δ, is the fault operator denoted $\vec{F}$ obtained by the following procedure.

1. Initialize $\vec{F}$ as $\vec{F}$=F.
2. For all level $\ell$ =1, 2, . . . , Δ do:
   (a) Let E=$\vec{F}_{\ell-0.5}$.
   (b) Conjugate E by the product of all unitary operations of $\mathcal{C}$ with level $\ell$.
   (c) Multiply $\vec{F}_{\ell+0.5}$ by E.

When propagating $\vec{F}_{\ell-0.5}$ through the operations with level $\ell$, the order in which these operations are selected is not relevant because they do not overlap.

The propagation $\vec{F}$ is defined in such a way that the operator $\vec{F}_{\ell+0.5}$ is the Pauli error resulting from all the faults occurring during the first $\ell$ levels of the circuit.

4.6. Effect of Circuit Faults

Consider a Clifford circuit $\mathcal{C}$ acting on n qubits with depth Δ. Assume that the circuit contains m Pauli measurements. The m measured operators are denoted by $S_1$, . . . , $S_m$ and for all j=1, . . . , m $\ell_j$ denotes the level of the measurement of the operator $S_j$.

Executing the quantum circuit $\mathcal{C}$ produces two types of data: (a) The outcome vector o∈ $\mathbb{Z}_2^m$ is the bit string whose j th component is the outcome of the measurement of $S_j$; and (b) The output state $\rho_o$ is the state of the n qubits of the system after running the circuit. The outcome vector is generally not deterministic. $\mathbb{P}$ denotes the outcome distribution of the circuit when the input state of the circuit is ρ, i.e. the circuit $\mathcal{C}$ returns the outcome vector o with probability $\mathbb{P}$ (o). The output state $\rho_o$ generally depends on the outcome vector o. A set of circuit faults represented by a fault operator F∈ $\overline{\mathcal{P}}_{n(\Delta+1)}$ can affect the outcome vector and the output state of the circuit.

The goal is to protect the outcome vector and the output state of the circuit from the effect of faults occurring throughout the circuit. Faults are represented by a fault operator F∈ $\overline{\mathcal{P}}_{n(\Delta+1)}$. The notation $\mathbb{P}_{\mathcal{C},\rho}^{(F)}$ is used for the outcome distribution of the circuit $\mathcal{C}$ with input state ρ with faults corresponding to F and the output state is denoted by $\rho_o^{(F)}$. The following proposition describes the effect of faults on the outcome vector and the output state.

Proposition 1. [Effect of faults] If F∈ $\overline{\mathcal{P}}_{n(\Delta+1)}$ then, $$\mathbb{P}_{\mathcal{C},\rho}^{(F)}(o)=\mathbb{P}_{\mathcal{C},\rho}(o+f) \text{ where } f=(f_1, \ldots, f_m) \in \mathbb{Z}_2^m$$

$$\text{such that } f_j=[\vec{F}_{\ell_j-0.5}, S_j], \quad (8)$$

$$\rho_o^{(F)}=E\rho_{o+f}E \text{ where } E=\vec{F}_{\Delta+0.5}. \quad (9)$$

The pair f,E associated with a fault operator F is called the effect of F and is denoted eff(F). In what follows, it is said that F flips the j th outcome of the circuit if $[\vec{F}_{\ell_j-0.5}, S_j]=1$, and the Pauli error E=$\vec{F}_{\Delta+0.5}$ refers to the residual error of F.

Proof. By definition of the propagation, the accumulation of the circuit faults occurring before the measurement of $S_j$ is equivalent to the Pauli error $\vec{F}_{\ell_j-0.5}$. As a result, an outcome vector o is mapped onto the vector o+f given in the proposition. When the vector o is observed, the output state is the state $E\rho_{o+f}E$ because o was mapped onto o+f and the accumulation of all the circuit faults acts as an error E= $\vec{F}_{\Delta+0.5}$ on the output state of the circuit.

4.7. Correction of Circuit Faults with Circuit Decoders

For the circuit to be correct in the presence of faults, it must be guaranteed that both the outcome vector and the output states can be recovered. An error affecting the outcome vector can be just as harmful as an error on the output state. For example, one can prepare a state |+⟩ by measuring X, which produces either |+⟩ with outcome 0 or |−⟩ with outcome 1. To obtain the state |+⟩, Z is applied to the qubit when the outcome 1 is observed. An incorrect outcome in this protocol directly translates into a qubit error.

The output of the circuit lives in a stabilizer code and therefore it is sufficient to correct the residual error up to a stabilizer of this code. Formally, define the output stabilizer group of the circuit, denoted ⟨$\mathcal{S}_o$⟩, to be the stabilizer group that keeps invariant all the possible output states $\rho_o$ of the circuit corresponding to the outcome o. An operator of ⟨$\mathcal{S}_o$⟩ is an output stabilizer, and the stabilizer code associated with the stabilizer group generated by ⟨$\mathcal{S}_o$⟩ is the output stabilizer code of the circuit. The output stabilizer group of a circuit can be computed efficiently as in Algorithm 1.

A circuit decoder for the circuit $\mathcal{C}$ is defined to be a map $$\mathbb{Z}_2^m \rightarrow \mathbb{Z}_2^m \times \overline{\mathcal{P}}_n \quad (10)$$

$$o \mapsto (\hat{f}, \hat{E}) \quad (11)$$

that takes as an input an outcome vector o and that returns an estimation of the outcome flips $\hat{f}$ and an estimation of the residual error $\hat{E}$.

Assume that the faults corresponding to F∈ $\overline{\mathcal{P}}_{n(\Delta+1)}$ occur and let (f,E)=eff(F) be the effect of F. The decoder is said to be successful if $\hat{f}$=f and if the error $\hat{E}$E is correctable for the output stabilizer code. In this context, 'correctable' means correctable for the output stabilizer code equipped with a decoder and a noiseless syndrome extraction circuit for the measurement of the stabilizer generators. This notion of correctability depends on the decoder used for the output code. Unless otherwise stated, a minimum weight error decoder is selected for the output code—i.e., a decoder returning a minimum weight Pauli error for a given syndrome.

Denote by $\rho_M$ the density matrix of the maximally mixed state $$\rho_M = \left(\frac{I}{2}\right)^{\otimes n}.$$

A most likely fault operator given an outcome vector o∈ $\mathbb{Z}_2^m$ is defined to be a fault operator $\hat{F} \in \overline{\mathcal{P}}_{n(\Delta+1)}$ that maximizes the product $$Q_{MLF}(\hat{F},o) = \mathbb{P}_{\mathcal{C},\rho_M}^{(\hat{F})}(o)\mathbb{P}_{\mathcal{F}}(\hat{F}). \quad (12)$$

This definition is motivated by Bayes' theorem, from which the probability of a fault operator $\hat{F}$ given an outcome o can be written as $$\mathbb{P}(\hat{F} \mid o) = \frac{\mathbb{P}_{\mathcal{C},\rho_M}^{(\hat{F})}(o)\mathbb{P}_{\mathcal{F}}(\hat{F})}{\sum_{\tilde{F} \in \overline{\mathcal{P}}_{n(\Delta+1)}} \mathbb{P}_{\mathcal{F}}(\tilde{F})\mathbb{P}_{\mathcal{C},\rho_M}^{(\tilde{F})}(o)} \quad (13)$$

where the input state of the circuit is chosen to be the maximally mixed state $\rho_M$ because no specific input state is assumed. For a fixed circuit and a fixed outcome vector, this number is proportional with $\mathbb{P}_{\mathcal{C},\rho_M}^{(\hat{F})}(o)\mathbb{P}_{\mathcal{F}}(\hat{F})$ because the denominator is independent of $\hat{F}$.

A circuit decoder that returns the effect of a most likely fault operator is said to be a most likely fault decoder or MLF decoder.

5. Properties of the Fault Propagation

This section introduces the main technical tools of this disclosure. Introduced here is the backpropagation, and it is shown in Proposition 3 that it is the adjoint of the propagation. This relation makes it possible to replace the fault propagation by the backpropagation of the measured operators and leads to the definition of stabilizer generators of the space-time code in Section 7.

5.1. Definition of the Backpropagation

The backpropagation of a fault operator F, denoted $\overleftarrow{F}$, is defined similarly to the propagation with the following procedure.

1. Initialize $\overleftarrow{F}$ as $\overleftarrow{F} = F$.
2. For all level $\ell = \Delta, \Delta-1, \ldots, 1$ do:
   (a) Let $E = \overleftarrow{F}_{\ell-0.5}$.
   (b) Conjugate E by the inverse of the product of all unitary operations of $\mathcal{C}$ with level $\ell$.
   (c) Multiply $\overleftarrow{F}_{\ell-0.5}$ by E.

Similarly to the propagation, the backpropagation $\overleftarrow{F}$ is defined in such a way that the operator $F_{\ell-0.5}$ is equivalent to the accumulation of all the faults occurring during the levels $\ell' \leq \ell$ of the circuit.

5.2. Explicit Propagation and Back-Propagation

The following proposition provides an explicit description of the propagation of a fault operator.

Proposition 2. [Explicit propagation and backpropagation] Let $\mathcal{C}$ be a Clifford circuit. Let $U_\ell$ be the product of all the unitary operations of the circuit with level $\ell$ and let $U_{i,j} = U_j U_{j-1} \ldots U_{i+1}$ for $j \geq i$. If F is a fault operator then for all $\ell \in \{0, 1, \ldots, \Delta\}$, $$\vec{F}_{\ell+0.5} = \prod_{i=0}^{\ell} U_{i,\ell} F_{i+0.5} U_{i,\ell}^{-1} \quad (14)$$

and $$\overleftarrow{F}_{\ell+0.5} = \prod_{j=\ell}^{\Delta} U_{\ell,j}^{-1} F_{j+0.5} U_{\ell,j}. \quad (15)$$

Therein, by convention, $U_{i,j} = I$ if $j \leq i$. When $j > i$, the operation $U_{i,j}$ is defined in such a way that it maps the faults occurring right after level i onto equivalent faults occurring right after level j.

Proof. The component $\vec{F}_{\ell+0.5}$ of $\vec{F}$ is obtained by conjugating all the components $F_{i+0.5}$ of F with $i \leq \ell$ through the level $i+1, i+2, \ldots \ell$ of the circuit. This corresponds to the conjugation by $U_{i,\ell}$, justifying the propagation formula.

To back-propagate $F_{j+0.5}$ from level $j+0.5$ to level $\ell+0.5$ with $j \geq \ell$, this operator is conjugated by the inverse of the unitary operations of the circuit at levels $\ell, \ell-1, \ldots, j+1$ in that order. This is equivalent to the conjugation by $$U_{j+1}^{-1} \ldots U_{\ell-1}^{-1} U_\ell^{-1} \quad (16)$$

which is equal to $U_{\ell,j}^{-1}$.

The operators $U_{i,j}$ obey the relations $$U_{a,c} = U_{b,c} U_{a,b}, \quad (17)$$

$$U_{b,c}^{-1} U_{a,c} = U_{a,b} \quad (18)$$

and $$U_{a,b} U_{a,c}^{-1} = U_{b,c}^{-1} \quad (19)$$

where a, b, c are three integers such that $0 \leq a \leq b \leq c \leq \Delta$.

Corollary 1. The propagation map and the backpropagation map are automorphisms of the group $\overline{\mathcal{P}}_{n(\Delta+1)}$.

Thanks to this corollary, one can write $$\vec{FG} = \vec{F}\vec{G} \quad (20)$$

and $$\overleftarrow{FG} = \overleftarrow{F}\overleftarrow{G} \quad (21)$$

for all fault operators F,G.

Proof. Based on Eq. (14), $$\vec{FG}_{\ell+0.5} = \prod_{i=0}^{\ell} U_{i,\ell} F_{i+0.5} G_{i+0.5} U_{i,\ell}^{-1} \quad (22)$$

$$= \prod_{i=0}^{\ell} U_{i,\ell} F_{i+0.5} U_{i,\ell}^{-1} U_{i,\ell} G_{i+0.5} G_{i+0.5} U_{i,\ell}^{-1} \quad (23)$$

$$= \prod_{i=0}^{\ell} U_{i,\ell} F_{i+0.5} U_{i,\ell}^{-1} \prod_{j=0}^{\ell} U_{j,\ell} G_{j+0.5} U_{j,\ell}^{-1} \quad (24)$$

$$= \vec{F}_{\ell+0.5} \vec{G}_{\ell+0.5} \quad (25)$$

Therein, it is possible to reorder the Pauli operators $U_{i,\ell} F_{i+0.5} U_{i,\ell}^{-1}$ and $U_{j,\ell} G_{j+0.5} U_{j,\ell}^{-1}$ because Pauli operators are considered up to a phase. This proves that the propagation map is a group morphism.

Therefore, the propagation map is $\mathbb{Z}_2$-linear map over $\overline{\mathcal{P}}_{n(\Delta+1)} \simeq \mathbb{Z}_2^{2n(\Delta+1)}$. To show that it is bijective, it suffices to see that its matrix is lower triangular with the identity on the diagonal in the basis obtained by concatenating a basis of Pauli operators acting on level 0, 1, . . . , Δ. One can show that the backpropagation is a group automorphism with the same technique.

5.3. Basic Properties of Pauli Commutators

For two Pauli operators P and Q, denote by $[P,Q] \in \mathbb{Z}_2$ the commutator of P and Q which takes the value 0 if P and Q commute and takes the value 1 otherwise.
In what follows, the following basic properties of the commutator are used. Let n,m be integers. For all Pauli operators $P,Q \in \overline{\mathcal{P}}_n$, $$[P,Q]=[Q,P]. \quad (26)$$

For all Pauli operators P, Q, R $\in \overline{\mathcal{P}}_n$, $$[P,QR]=[P,Q]+[P,R](\bmod 2). \quad (27)$$

For all Pauli operators $P,Q \in \overline{\mathcal{P}}_n$ and $P',Q' \in \overline{\mathcal{P}}_m$, $$[P \otimes P', Q \otimes Q']=[P,Q]+[P',Q'](\bmod 2). \quad (28)$$

For all Pauli operators $P,Q \in \overline{\mathcal{P}}_n$ and for all Clifford unitary operations U, $$[P,Q]=[UPU^{-1},UQU^{-1}]. \quad (29)$$

5.4. Interplay Between Fault Propagation and Commutation

Based on Proposition 1, to clarify the effect of faults on the outcomes of a circuit, it is important to understand the interplay between fault propagation and commutation. The following proposition is a key technical result of this disclosure and is used many times in the rest of the disclosure. It proves that the back-propagation is the adjoint of the propagation.

Proposition 3. [Propagation adjoint] For all fault operators F, C for a circuit $\mathcal{C}$, $$[\vec{F},G]=[F,\overleftarrow{G}]. \quad (30)$$

Proof. Because $\vec{F} = \otimes_{\ell=0}^{\Delta} \vec{F}_{\ell|0.5}$ and $G = \otimes_{\ell=0}^{\Delta} G_{\ell|0.5}$, $$[\vec{F}, G] = \sum_{\ell=0}^{\Delta} [\vec{F}_{\ell+0.5}, G_{\ell+0.5}] \quad \text{Using Eq. (28)}$$

$$= \sum_{\ell=0}^{\Delta} \left[ \prod_{i=0}^{\ell} \left( U_{i,\ell} F_{i+0.5} U_{i,\ell}^{-1} \right), G_{\ell+0.5} \right] \quad \text{Using Eq. (14)}$$

$$= \sum_{\ell=0}^{\Delta} \sum_{i=0}^{\ell} \left[ U_{i,\ell} F_{i+0.5} U_{i,\ell}^{-1}, G_{\ell+0.5} \right] \quad \text{Using Eq. (27)}$$

$$= \sum_{\ell=0}^{\Delta} \sum_{i=0}^{\ell} \left[ F_{i+0.5}, U_{i,\ell}^{-1} G_{\ell+0.5} U_{i,\ell} \right] \quad \text{Using Eq. (29)}$$

$$= \sum_{i=0}^{\Delta} \sum_{\ell=i}^{\Delta} \left[ F_{i+0.5}, U_{i,\ell}^{-1} G_{\ell+0.5} U_{i,\ell} \right]$$

Interchanging the summation order $$= \sum_{i=0}^{\Delta} \left[ F_{i+0.5}, \prod_{\ell=i}^{\Delta} \left( U_{i,\ell}^{-1} G_{\ell+0.5} U_{i,\ell} \right) \right] \quad \text{Using Eq. (27)}$$

$$= \sum_{i=0}^{\Delta} \left[ F_{i+0.5}, \overleftarrow{G}_{i+0.5} \right] \quad \text{Using Eq. (15)}$$

$$= [F, \overleftarrow{G}]. \quad \text{Using Eq. (28)}$$

In the last equality are used the factorizations $F=\otimes_{i=0}^{\Delta} F_{i+0.5}$ and $\overleftarrow{G} = \otimes_{i=0}^{\Delta} \overleftarrow{G}_{i+0.5}$.

6. The Outcome Code of a Clifford Circuit

Figure 6:
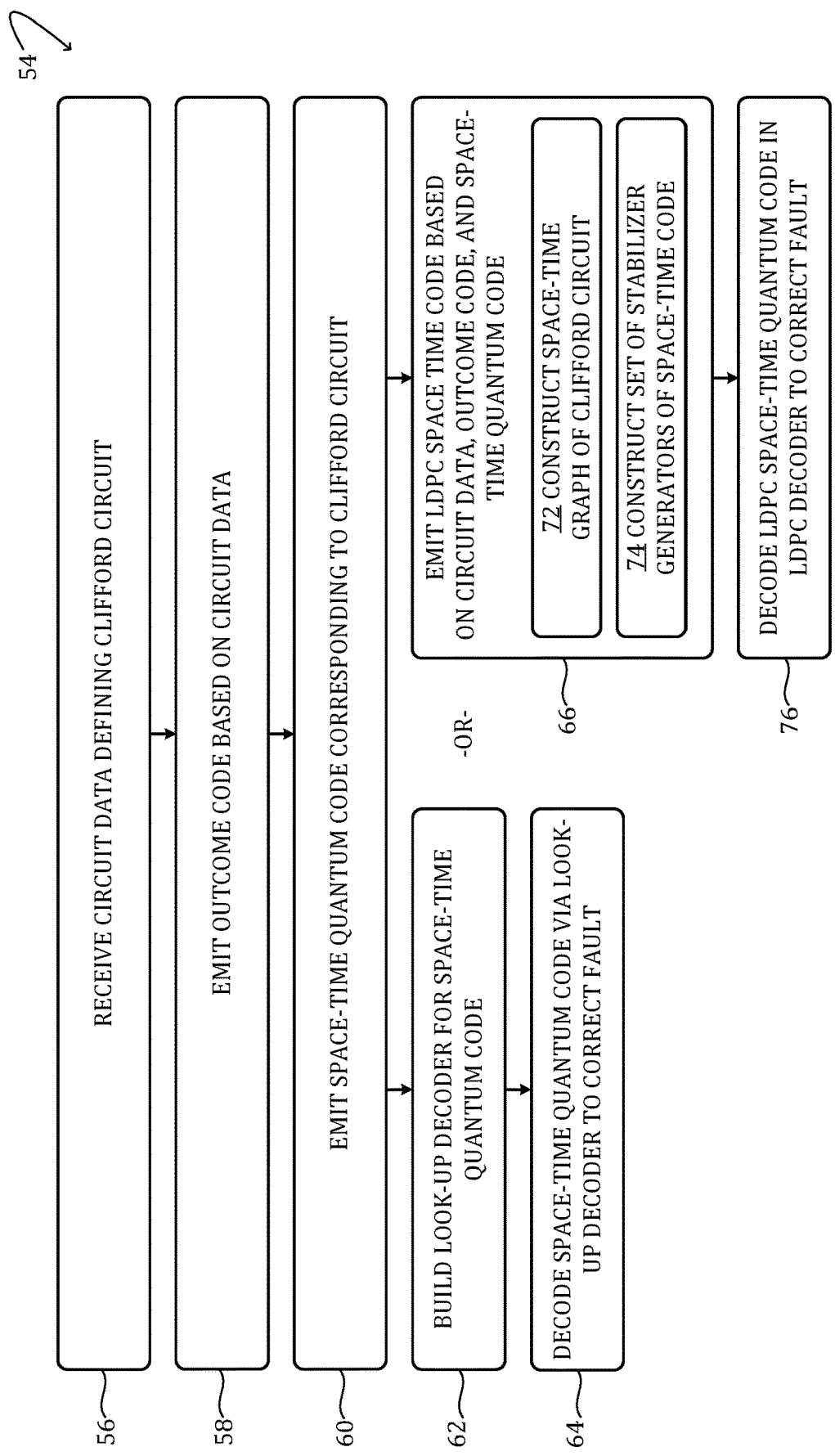
FIG. 6 shows aspects of an example method to correct a fault in the application of a Clifford circuit to a qubit register of a quantum computer

FIG. 6 shows aspects of an example method 54 to correct a fault in application of a Clifford circuit to a qubit register of a quantum computer.

At 56 of method 54, circuit data defining the Clifford circuit is received. In some examples the Clifford circuit may include one or more Clifford gates. In these and other examples, the Clifford circuit may include one or more Pauli measurements—e.g., redundant measurements. For a significant subset of the problems to which method 54 is applicable, the Clifford circuit may be an error-syndrome extraction circuit. That aspect, however, is not strictly necessary.

At 58 outcome code based on the circuit data is emitted. The outcome code includes a series of outcome checks each corresponding to an anticipated error syndrome of the application of the Clifford circuit to the qubit register. At 60 space-time quantum code corresponding to the Clifford circuit is emitted. The space-time quantum code is emitted based on the circuit data and on the outcome code. The space-time quantum code includes a series of check operators that support quantum-error correction, thereby enabling fault correction in the application of the Clifford circuit to the qubit register. In some examples, the space-time quantum code is a quantum-stabilizer code. In some examples, each of the check operators is a stabilizer generator of the space-time quantum code. Here the measurement of each stabilizer generator returns a result of a corresponding outcome check of the outcome code.

The space-time quantum code emitted at 60 may be used in various ways, two of which are illustrated in FIG. 6. At 62 a lookup decoder for the space-time quantum code is built. Then, at 64, pursuant to detection of a fault in the application of the Clifford circuit, the space-time quantum code is decoded via the lookup decoder to correct the fault in the application of the Clifford circuit to the qubit register.

The branch starting at 66 of method 54 illustrates a different implementation. At 66 the LDPC space-time quantum code is emitted. The LDPC space-time quantum code is based on the circuit data, the outcome code, and the space-time quantum code. The LDPC space-time quantum code includes connected stabilizers of the space-time quantum code up to a predetermined weight. In some examples, emitting the LDPC space-time quantum code comprises receiving the space-time quantum code in D dimensions and producing local stabilizer generators in D+1 dimensions.

In the more particular, illustrated example, emitting the LDPC space-time quantum code comprises, at 72 constructing a space-time graph of the Clifford circuit; and at 74 constructing a set of stabilizer generators of the space-time code that are supported on local regions of the space-time graph. In these and other examples, pursuant to detection of a fault in the application of the Clifford circuit, the LDPC space-time quantum code, at 76, is decoded in an LDPC decoder to correct the fault in the application of the Clifford circuit to the qubit register.

Operationally, method 54 may be enacted on a classical computer system coupled operatively to a quantum computer. As described hereinafter, the classical computer system comprises one or more processors and, operatively coupled to the one or more processors, computer memory holding instructions corresponding to method 54. Such instructions may include instructions (A) corresponding to step 56, instructions (B) corresponding to step 58, etc.

In this section, it is shown that the set of possible outcome vectors of a Clifford circuit is almost linear code. 'Almost' means that it is not a linear subspace but an affine subspace of $\mathbb{Z}_2^m$ for some integer m. However, by changing the description of the circuit, one can make it a proper linear code. An algorithm is proposed to efficiently compute a set of checks for this code. The outcome code can be used to detect and correct faults in a Clifford circuit. A Clifford circuit $\mathcal{C}$ is considered to act on n qubits with depth $\Delta$ containing m measurements. $S_j$ denotes the measured operators for j=1, ..., m and $\ell_j$ is the level of the measurement of the operator $S_j$. In this context, FIG. 7 shows aspects of an example algorithm for construction of the checks of the outcome code of a Clifford circuit.

In many cases, the outcomes observed through a circuit are not independent. For instance, if a measurement is repeated twice in a row, one expects to obtain the same outcome twice. The following proposition proves that the set of outcomes of a Clifford circuit is an affine subspace. It is defined by a set of affine checks of the form $\Sigma_{k \in K} o_k = 0$ or 1.

Proposition 4. [Outcome code of a Clifford circuit] The set of all possible outcome vectors for a Clifford circuit $\mathcal{C}$ with m Pauli measurements is an affine sub space $\mathcal{O}(\mathcal{C})$ of $\mathbb{Z}_2^m$. Moreover a set of affine equations defining $\mathcal{O}(\mathcal{C})$ is computed by Algorithm 1. The proof of Proposition 4 is derived from the following lemma.

Lemma 1. Stabilizer update rules Let $|\psi\rangle$ be a state of a stabilizer code $C(\mathcal{S})$ with length n and assume that the Pauli operator $M \in \mathcal{P}_n$ is measured with outcome $o \in \{-1, +1\}$. Then, the following holds.
1. If $\pm M \in \langle \mathcal{S} \rangle$, the outcome of the measurement of M is ±1 and the state of the system is unchanged after measurement.
2. If $\pm M \notin \langle \mathcal{S} \rangle$ and M commutes with all the elements of $\mathcal{S}$. Denote $\mathcal{S}' = \mathcal{S} \cup \{M\}$.
   (a) For all outcomes $o \in \{+1, -1\}$ there exists a state of $C(\mathcal{S})$ such that the measurement of M has outcome o with non-zero probability.
   (b) For all states $|\psi'\rangle$ in $C(\mathcal{S}')$ there exists a state $|\psi\rangle \in C(\mathcal{S})$ such that the measurement of M projects $|\psi\rangle$ onto $|\psi'\rangle$ with non-zero probability.
3. If $\pm M \notin \langle \mathcal{S} \rangle$ and M anti-commutes with an element $S_1$ of $\langle \mathcal{S} \rangle$. Let $S_1, S_2, \ldots, S_r$ be a generating set for $\langle \mathcal{S} \rangle$ such that $S_2, \ldots, S_r$ commute with M. Denote $\mathcal{S}' = \{M, S_2, \ldots, S_r\}$.
   (a) For all outcomes $o \in \{+1, -1\}$ there exists a state of $C(\mathcal{S})$ such that the measurement of M has outcome o with non-zero probability.
   (b) For all states $|\psi'\rangle$ in $C(\mathcal{S}')$ there exists a state $|\psi\rangle \in C(\mathcal{S})$ such that the measurement of M projects $|\psi\rangle$ onto $|\psi'\rangle$ with non-zero probability.

Proof. The first item is an immediate consequence of the postulates of quantum mechanics. Consider the second item. For the state $$|\psi_o\rangle = \frac{I + (-1)^o M}{2} |\psi\rangle$$

where $|\psi\rangle$ is a state of $C(\mathcal{S})$, the outcome of the measurement M is o with probability 1 proving the first part. Moreover, the measurement of M maps any state $|\psi'\rangle$ of $C(\mathcal{S}')$ onto itself with probability 1.

The third item remains to proven. Consider a set of logical operators $\overline{X}_1, \overline{Z}_1, \ldots, \overline{X}_k, \overline{Z}_k$ of the stabilizer code $C(\mathcal{S})$. Without loss of generality, one can assume that all these logical operators commute with M. Otherwise, if a logical operator L anti-commutes with M, replace L by $LS_1$ which is another representative of the same logical operator. Therefore, the operators $\overline{X}_1, \overline{Z}_1, \ldots, \overline{X}_k, \overline{Z}_k$ also form a basis of logical operators for the code $C(\mathcal{S})$.

Consider the logical state $|\overline{x}\rangle$ the stabilizer code $C(\mathcal{S})$ where $x \in \mathbb{Z}_2^k$. It is the state of $C(\mathcal{S})$ fixed by the operators $(-1)^{x_i} \overline{Z}_i$. This state is mapped onto the logical state $|\overline{x}\rangle$ of $C(\mathcal{S}')$ with probability 1/2. To see this, denote $\mathcal{S}_x = \mathcal{S} \cup \{(-1)^{x_1}\overline{Z}_1, \ldots, (-1)^{x_k}\overline{Z}_k\}$. Then, $\langle \hat{x} \rangle = 2^{-n} \Sigma_{S \in \mathcal{S}_x} S$ and the measurement of M produces the outcome o with probability $$tr\left(\frac{I + (-1)^o M}{2} \langle \overline{x} \rangle\right) = 2^{-(n+1)} \left(tr \sum_{S \in \langle \mathcal{S}_x \rangle} S + (-1)^o tr \sum_{S \in \langle \mathcal{S}_x \rangle} MS\right) = 1/2. \quad (31)$$

Indeed, the first sum is $\Sigma_{S \in \langle \mathcal{S}_x \rangle} S = 2^n$ because all the Pauli operators are traceless except the identity which has trace $2^n$. The second sum is trivial because $MS = \pm I$ would imply $\pm M \in \mathcal{S}_x$ which is impossible because M anti-commute with $\mathcal{S}_x$.

Thus demonstrated is the existence of a state $|\hat{x}\rangle$ of $C(\mathcal{S})$ which leads both measurement outcomes o=0 or 1 with probability 1/2. Moreover, its image when the outcome is trivial is the state $|\overline{x}\rangle$ of the code $C(\mathcal{S}')$. Therefore, it is possible to reach any of the basis state $|\overline{x}\rangle$ of $C(\mathcal{S}')$ from some state of $C(\mathcal{S})$ by measuring M. By linearity of the projection, this proves that one can reach any state of the code $C(\mathcal{S}')$.

Proof. [Proof of Proposition 4] Based on Lemma 1, the set of states that belong to the output of the subcircuit $(C_1, \ldots, C_{i-1})$ is a stabilizer code. Moreover, a set of stabilizer generators $\mathcal{S}_{i-1}$ for this code is computed by updating the stabilizer generators of the circuit after each operation as in Algorithm 1.

If the operator $C_i$ is the measurement of an operator $S_j$ such that neither $S_j$ nor $-S_j$ belong to the stabilizer group of the outcome of the circuit $(C_1, \ldots, C_{i-1})$, then the outcome $o_j$ can be either 0 or 1. However, if $\pm S_j$ belongs to the stabilizer group, its outcome is constrained and this defined a check of the affine code. This check is computed in Algorithm 1.

Without loss of generality, one can assume that the outcome code $\mathcal{O}(\mathcal{C})$ of a Clifford circuit not only an affine subspace but also a proper $\mathbb{Z}_2$-linear code. Indeed, replacing the measured operator $S_j$ by $-S_j$ for all the measurements such that $-S_j \in \langle \mathcal{S} \rangle$ in Algorithm 1 makes all the checks linear without modifying the output of the circuit. This leads to the following corollary.

Corollary 2. [Linearization of the outcome code] Let $\mathcal{C}$ be a Clifford circuit and let $\mathcal{C}'$ the circuit obtained by running Algorithm 1 and replace $S_j$ by $-S_j$ if the condition $-S_j \in \langle S \rangle$ is met. Then the outcome code of $C'$ is a linear code.

In what follows, it is assumed that the outcome code $\mathcal{O}(C)$ is linear. One may refer to a vector of $\mathcal{O}(C)^\perp$ as a check of the outcome code $\mathcal{O}(C)$. The outcome code can be immediately used to correct faults in a quantum circuit. Indeed, a fault configuration induces a flip of some of the circuit outcomes which can be detected using the values of the checks of the outcome code.

7. Check Operators

Introduced here is a set of Pauli operators associated with the checks of the outcome code that is used later to define a stabilizer code associated with the Clifford circuit.

7.1. Definition of Check Operators

It is convenient to introduce another notation from [Ref. 1]. The fault operator $F \in \overline{\mathcal{P}}_{n(\Delta+1)}$ obtained by placing a n-qubit Pauli operator P at level $\ell+0.5$ is denoted $\eta_{\ell+0.5}(P)$. By definition, $F_{\ell+0.5}=P$ and $F_{\ell'+0.5}=I$ for all $\ell' \neq \ell$. For any vector $u \in \mathcal{O}(C)^\perp$, define the check operator to be the fault operator $\overleftarrow{F(u)}$ obtained by back-propagating the fault operator $$F(u) = \prod_{\substack{j=0 \\ u_j=1}}^{m} \eta_{\ell_j-0.5}(S_j) \tag{32}$$

Recall that $S_1, \ldots, S_m$ are the m measured operators of the circuit and $S_j$ is measured at level $\ell_j$. In other words, F(u) is the fault operator obtained by placing each measured operator $S_j$ with $u_j=1$ at the level right before it is measured.

One may prefer to use the propagation instead of the backpropagation. Then, one can define the propagation operators as $\overrightarrow{F'(u)}$ where $$F'(u) = \prod_{\substack{j=0 \\ u_j=1}}^{m} \eta_{\ell_j+0.5}(S_j). \tag{33}$$

The definition is discussed in Section 13 where it is proved that $\overleftarrow{F(u)} = \overrightarrow{F'(u)}$ for vectors u of $\mathcal{O}(C)^\perp$. In what follows, $\overleftarrow{F(u)}$ is preferred because it makes some proofs more straightforward. What makes the backpropagation natural is the fact that it is the adjoint of the propagation (Proposition 3). Informally, that means that one can replace the propagation of faults by the backpropagation of measurements. This assertion will be made rigorous throughout this section.

Proposition 5. The map $u \mapsto \overleftarrow{F(u)}$ is an injective group morphism from $\mathbb{Z}_2^m$ to $\overline{\mathcal{P}}_{n(\Delta+1)}$.

Proof. For all $u, v \in \mathbb{Z}_2^m$, the operators F(u) and F(v) satisfy F(u)F(v)=F(u+v). Combined with Eq. (21), this leads to $\overleftarrow{F(u)}\overleftarrow{F(v)} = \overleftarrow{F(u+v)}$ which proves that $u \mapsto \overleftarrow{F(u)}$ is a group morphism. It is injective as the composition of an injective map $u \mapsto F(u)$ and a bijection $F \mapsto \overleftarrow{F}$ (Corollary 1).

Used extensively in what follows is the relation $\overleftarrow{F(u+v)} = \overleftarrow{F(u)}\overleftarrow{F(v)}$ which is a consequence of Proposition 5.

7.2. Outcomes of the Check Operators

The section relates the value of a check of the outcome code to the measurement outcome of a check operators, justifying the definition of check operators.

The first lemma provides a description of the outcomes flipped by a set of faults as a commutator of the corresponding fault operator.

Lemma 2. Outcome flip Let F be a fault operator. The faults corresponding to F induce a flip of the measurement of $S_j$ iff $[\vec{F}, \eta_{\ell_j-0.5}(S_j)]=1$.

Proof. Based on Proposition 1, the faults represented by F induce a flip of the outcome of $S_j$ iff $[\vec{F}_{\ell_j-0.5}, S_j]=1$ and because $\eta_{\ell_j-0.5}(S_j)$ is trivial on all level but $\ell_j-0.5$, $[\vec{F}_{\ell_j-0.5}, S_j]=[\vec{F}, \eta_{\ell_j-0.5}(S_j)]$.

The following Lemma shows that the measurement of a check operators returns the value of the corresponding check of the outcome code.

Lemma 3. Check operator outcome Let F be a fault operator. The faults corresponding to F induce a flip of an outcome check $u \in \mathcal{O}(C)^\perp$ iff $[F, \overleftarrow{F(u)}]=1$.

Proof. By definition of F(u), $$\left[F, \overleftarrow{F(u)}\right] = \left[F, \overleftarrow{\prod_{\substack{j=0 \\ u_j=1}}^{m} \eta_{\ell_j-0.5}(S_j)}\right] \tag{34}$$

which leads to $$\left[F, \overleftarrow{F(u)}\right] = \left[F, \prod_{\substack{j=0 \\ u_j=1}}^{m} \overleftarrow{\eta_{\ell_j-0.5}(S_j)}\right] \quad \text{Using Eq. (21)}$$

$$= \sum_{\substack{j=0 \\ u_j=1}}^{m} \left[F, \overleftarrow{\eta_{\ell_j-0.5}(S_j)}\right] \quad \text{Using Eq. (27)}$$

$$= \sum_{\substack{j=0 \\ u_j=1}}^{m} \left[\vec{F}, \eta_{\ell_j-0.5}(S_j)\right] \quad \text{By Proposition. 3}$$

By Lemma. 2, this last sum coincides with the check $\Sigma_j u_j o_j$ of the outcome code corresponding to the vector u.

The next lemma states that an error $S_j$ right before or right after the measurement of $S_j$ does not flip any of the check operator outcomes.

Lemma 4. Stabilizer error For all $u \in \mathcal{O}(C)^\perp$ and for all measured operator $S_j$, $[\eta_{\ell_j=0.5}(S_j), \overleftarrow{F(u)}]=0$.

Proof. Because $S_j$ belongs to the stabilizer group of system right after level $\ell_j$, the faults corresponding to $\eta_{\ell_j+0.5}(S_j)$ do not flip any of the checks of the outcome code. Based on Lemma 3, this leads to the lemma for the sign $\ell_j+0.5$. The same result holds for $\ell_j+0.5$ because a fault $S_j'$ after the measurement of $S_j$ is equivalent to a fault $S_j$ before this measurement.

A Pauli error on the input state also keeps the check operator outcomes trivial.

Lemma 5. Input error For all $u \in \mathcal{O}(\mathcal{C})^\perp$ and for all $P \in \overline{\mathcal{P}}_n$, $[\eta_{0.5}(P), \overleftarrow{F(u)}]=0$.

Proof. An fault $P$ on the input state of the circuit cannot flip the value of a check because the outcome code $\mathcal{O}(\mathcal{C})$ is the set of outcomes for all possible input states. Based on Lemma 3, this implies $[\eta_{0.5}(P), \overleftarrow{F(u)}]=0$ for all check $u$ of the outcome code.

7.3. Commutation of the Check Operators

The goal of this section is to prove that check operators are pairwise commuting. Proposition 6. Let $\mathcal{C}$ be a Clifford circuit. For all $u, v \in \mathcal{O}(\mathcal{C})^\perp$, $[\overleftarrow{F(u)}, \overleftarrow{F(v)}]=0$.

Proof. Based on Eq. (28), $$\left[\overleftarrow{F(u)}, \overleftarrow{F(v)}\right] = \sum_{\ell=0}^{\Delta}\left[\overleftarrow{F(u)}_{\ell+0.5}, \overleftarrow{F(v)}_{\ell+0.5}\right] \quad (35)$$

In the remainder of this proof, it is demonstrated by induction on $\ell$ (in decreasing order) that $[\overleftarrow{F(u)}_{\ell-0.5}, \overleftarrow{F(v)}_{\ell-0.5}]=0$ for all $\ell$.

For $\ell=\Delta$, by definition, $F(u)_{\Delta+0.5}=F(v)_{\Delta+0.5}=I$ and therefore $\overleftarrow{F(u)}_{\Delta+0.5}=\overleftarrow{F(v)}_{\Delta+0.5}=I$ which yields $[\overleftarrow{F(u)}_{\Delta+0.5}, \overleftarrow{F(v)}_{\Delta+0.5}]=0$.

Assume now that $[\overleftarrow{F(u)}_{\ell+1.5}, \overleftarrow{F(v)}_{\ell+1.5}]=0$. It will now be proved that $[[\overleftarrow{F(u)}_{\ell-0.5}, \overleftarrow{F(v)}_{\ell-0.5}]]=0$. Using Proposition 2 and Eq. (17) is found $$\overleftarrow{F(u)}_{\ell+0.5} = \prod_{j=\ell}^{\Delta} U_{\ell,j}^{-1} F(u)_{j+0.5} U_{\ell,j} \quad (36)$$

$$= F(u)_{\ell+0.5} \prod_{j=\ell+1}^{\Delta} U_{\ell,j}^{-1} F(u)_{j+0.5} U_{\ell,j} \quad (37)$$

$$= F(u)_{\ell+0.5} \prod_{j=\ell+1}^{\Delta} \left(U_{\ell+1,j} U_{\ell,\ell+1}\right)^{-1} F(u)_{j+0.5} U_{\ell+1,j} U_{\ell,\ell+1} \quad (38)$$

$$= F(u)_{\ell+0.5} U_{\ell,\ell+1}^{-1} \left(\prod_{j=\ell+1}^{\Delta} U_{\ell+1,j}^{-1} F(u)_{j+0.5} U_{\ell+1,j}\right) U_{\ell,\ell+1} \quad (39)$$

$$= F(u)_{\ell+0.5} U_{\ell,\ell+1}^{-1} \overleftarrow{F(u)}_{\ell+1.5} U_{\ell,\ell+1} \quad (40)$$

The same holds for $v$, that is $\overleftarrow{F(v)}_{\ell+0.5}=F(v)_{\ell-0.5} U_{\ell,\ell+1}^{-1} \overleftarrow{F(v)}_{\ell+1.5} U_{\ell,\ell+1}$. Using these expressions for $\overleftarrow{F(u)}_{\ell-0.5}$ and $\overleftarrow{F(v)}_{\ell+0.5}$ and applying Eq. (27), $$\left[\overleftarrow{F(u)}_{\ell+0.5}, \overleftarrow{F(v)}_{\ell+0.5}\right] = [F(u)_{\ell+0.5}, F(v)_{\ell+0.5}] + \quad (41)$$

$$U_{\ell,\ell+1}^{-1} \overleftarrow{F(u)}_{\ell+1+0.5} U_{\ell,\ell+1}, \quad (42)$$

$$U_{\ell,\ell+1}^{-1} \overleftarrow{F(v)}_{\ell+1+0.5} U_{\ell,\ell+1}\right] +$$

$$\left[F(u)_{\ell+0.5}, U_{\ell,\ell+1}^{-1} \overleftarrow{F(v)}_{\ell+1+0.5} U_{\ell,\ell+1}\right] + \quad (43)$$

$$\left[U_{\ell,\ell+1}^{-1} \overleftarrow{F(u)}_{\ell+1+0.5} U_{\ell,\ell+1}, F(v)_{\ell+0.5}\right]. \quad (44)$$

It will now be shown that each of these four terms is trivial. The first one $[F(u)_{\ell+0.5}, F(v)_{\ell+0.5}]$ is trivial by definition of the $F(u)$ and $F(v)$. Using Eq. (29) and the induction hypothesis, $$[U_{\ell,\ell}^{-1} \overleftarrow{F(u)})_{\ell-1.5} U_{\ell,\ell+1}, U_{\ell,\ell}^{-1} \overleftarrow{F(v)})_{\ell+1.5} U_{\ell,\ell+1}]=[[\overleftarrow{F(u)}_{\ell-1.5}, \overleftarrow{F(v)}_{\ell-1.5}]=0 \quad (45)$$

proving that the second term is trivial. Because the operator $U_{\ell,\ell+1}$ is the product of the unitary gates at level $\ell+1$ and $F(u))_{\ell+0.5}$ and $F(v))_{\ell+0.5}$ corresponds to measurements at the same level support of $U_{\ell,\ell+1}$ cannot overlap with the supports of $F(u))_{\ell-0.5}$ and $F(v))_{\ell+0.5}$. As a result $U_{\ell,\ell+1}$ acts trivially on $F(u))_{\ell-0.5}$ and $F(v))_{\ell+0.5}$. Therefore, $$\left[F(u)_{\ell+0.5}, U_{\ell,\ell+1}^{-1} \overleftarrow{F(v)}_{\ell+1+0.5} U_{\ell,\ell+1}\right] = \begin{bmatrix} U_{\ell,\ell+1} F(u)_{\ell+0.5} U_{\ell,\ell+1}^{-1}, \\ \overleftarrow{F(v)}_{\ell+1.5} \end{bmatrix} \quad (46)$$

$$= \left[F(u)_{\ell+0.5}, \overleftarrow{F(v)}_{\ell+1.5}\right]. \quad (47)$$

Therein, was used Eq. (29) in the first equality. To see that $[F(u))_{\ell+0.5}, \overleftarrow{F(v)})_{\ell+1.5}]=0$, write this commutator as $$[F(u))_{\ell+0.5}, \overleftarrow{F(v)}_{\ell+1.5}]=[\eta_{\ell+1.5}(F(u))_{\ell+0.5}), \overleftarrow{F(v)}]. \quad (48)$$

and apply Lemma 4. This lemma can be applied because $F(u))_{\ell+0.5}$ is a product of some measured operators $S_j$ with level $\ell_j=\ell+1$ in the circuit. It was proved that the third term is trivial. By symmetry, the fourth term is trivial by the same argument. This proves that $[\overleftarrow{F(u)}_{\ell-0.5}, \overleftarrow{F(v)}_{\ell+0.5}]=0$ concluding the proof of the proposition.

8. The Space-Time Code of a Clifford Circuit

Introduced in this section is a stabilizer code associated with a Clifford circuit. It is shown that the problem of correcting faults in a circuit reduces to the problem of correcting Pauli errors in this stabilizer code.

8.1. The Space-Time Code

The following theorem proves that the check operators $\overleftarrow{F(u)}$ form a stabilizer group. The corresponding stabilizer code is referred to as the space-time code of the circuit, denoted $\mathcal{Q}(\mathcal{C})$.

Theorem 1. The space-time code. Let $\mathcal{C}$ be a Clifford circuit with depth $\Delta$. Then, the set of all the check operators $\overleftarrow{F(u)}$ with $u \in \mathcal{O}(\mathcal{C})^\perp$ is a stabilizer group. Moreover, if the outcome code $\mathcal{O}(\mathcal{C})$ of the circuit has parameters $[m,k]$, the space-time code of the circuit $\mathcal{Q}$ ($\mathcal{C}$) has parameters [[N,K]] with N=n(Δ+1) and K=N−(m−k).

Proof. Based on Proposition 5, the set of operators $\overleftarrow{F(u)}$ with u∈ $\mathcal{O}(\mathcal{C})^\perp$ is a subgroup of $\mathcal{P}_{n(\Delta+1)}$. Proposition 6 proves that this subgroup is commutative. Moreover, it cannot contain −I because the map $u \mapsto \overleftarrow{F(u)}$ is injective. Another consequence of the injectivity is that the rank of the image stabilizer group is equal to the dimension of $\mathcal{O}(\mathcal{C})^\perp$ which is m−k. This provides the stabilizer code parameters.

8.2. Logical Operators of the Space-Time Code

To describe the logical operators of the space-time code, some notation will be introduced. For any $\ell=1,\ldots,\Delta$ and for any P∈ $\overline{\mathcal{P}}_n$, define the fault operator F(P, $\ell$) as $$G(P,\ell) = \eta_{\ell-0.5}(P)\,\eta_{\ell+0.5}(U_{\ell-1,\ell}\,P\,U_{\ell-1,\ell}) \quad (49)$$

These operators satisfy $$\overrightarrow{G(P,\ell)} = \eta_{\ell-0.5}(P). \quad (50)$$

For any vector v∈ $\mathbb{Z}_2^m$, define the fault operator L(v) as $$L(v) = \prod_{j=1}^{m} G(P_j,\ell_j)^{v_j} \quad (51)$$

where $\ell_j$ is the level of the j th measured operator $S_j$ and $P_j \in \overline{\mathcal{P}}_n$ is an arbitrary Pauli operator acting on the support of $S_j$ that anti-commute with $S_j$. Because $P_j$ is included in the support of $S_j$ it commutes with all the other measured operator at level $\ell_j$.

Proposition 7. Let $\mathcal{C}$ be a Clifford circuit acting on n qubits with depth Δ. The stabilizers and logical operators of the space-time code are generated by the following operators.

1. A set of operators $\eta_{\Delta+0.5}(P)$ where P∈ $\overline{\mathcal{P}}_n$ runs over a basis of $\overline{\mathcal{P}}_n$.
2. A set of operators G(P, $\ell$) for all $\ell=1,\ldots,\Delta$ where P∈ $\overline{\mathcal{P}}_n$ runs over a basis of the space of Pauli operators that commutes with all the measured operators at level $\ell$.
3. A set of operators L(v) where v∈ $\mathbb{Z}_2^m$ runs over a basis of the space $\mathcal{O}(\mathcal{C})$.

The following lemma is used in the proof of the proposition.

Lemma 6. For all u, v∈ $\mathbb{Z}_2^m$, $|\overleftarrow{F(u)},L(v)] = (u|v)$.

Proof.

$$[\overleftarrow{F(u)}, L(v)] = [F(u), \overrightarrow{L(v)}] \quad \text{By Proposition 3}$$

$$= \left[F(u), \overrightarrow{\prod_{j=1}^{m} L(P_j,\ell_j)^{v_j}}\right] \quad \text{By definition of } L(v)$$

$$= \left[F(u), \prod_{j=1}^{m} \overrightarrow{G(P_j,\ell_j)}^{v_j}\right] \quad \text{By Eq. (20)}$$

$$= \sum_{j=1}^{m} v_j \left[F(u), \overrightarrow{G(P_j,\ell_j)}\right] \quad \text{By Eq. (27)}$$

$$= \sum_{j=1}^{m} v_j \left[F(u), \eta_{\ell_j-0.5}(P_j)\right] \quad \text{By Eq. (50)}$$

$$= \sum_{j=1}^{m} v_j \left[F(u)_{\ell_j-0.5}, P_j\right]$$

By definition of $P_j$, $[F(u)_{\ell_j-0.5}, P_j] = u_j$ which yields $|\overleftarrow{F(u)},L(v)] = (u|v)$.

Proof. [Proof of Proposition 7] First it will be proved that these three families of operators are logical operators of the space-time code, that is that they commute with all stabilizers $\overleftarrow{F(u)}$ with u∈ $\mathcal{O}(\mathcal{C})^\perp$.

The operators of the form $\eta_{\Delta+0.5}(P)$ satisfy $$[\overleftarrow{F(u)}, \eta_{\Delta+0.5}(P)] = [F(u), \overrightarrow{\eta_{\Delta+0.5}(P)}] \quad (52)$$

$$= [F(u), \eta_{\Delta+0.5}(P)] \quad (53)$$

which is trivial because F(u) is trivial over level Δ+0.5.

For the operators G(P, $\ell$), $$[\overleftarrow{F(u)}, G(P,\ell)] = [F(u), \overrightarrow{G(P,\ell)}] \quad (54)$$

which is equal to $[F(u), \eta_{\ell-0.5}(P)]$ by Eq. 50. Because P commute with all the measured operators at level $\ell$, $$[\overleftarrow{F(u)}, G(P,\ell)] = [\eta_{\ell-0.5}(P), F(u)] \quad (55)$$

$$= [F(u)_{\ell-0.5}, P] = 0. \quad (56)$$

For the operators L(v), based on Lemma 6, $|\overleftarrow{F(u)}, L(v)] = (u|v)$ and this inner product is trivial because v is in the code $\mathcal{O}(\mathcal{C})$ and u belongs to its dual.

To prove that these three families of operators generate all stabilizers and logical operators, it is enough to show that the group they generate has rank 2K+R where K is the number of logical qubits of the stabilizer code and R is the rank of the stabilizer group. For the space-time code, K=n(Δ+1)−r and R=r Denote by $L_1, L_2, L_3$ the subgroups of $\overline{\mathcal{P}}_n(\delta+1)$ generated by these three sets of operators. $L_1 \cap L_2 = \{I\}$ because the operators of $L_2$ are supported on at least two levels and $L_1$ has support on level Δ+0.5. Also, $L_1 \cap L_3 = \{I\}$ because the operators of $L_1$ cannot flip any outcome and the only operator of $L_3$ that induces no outcome flip is I. The same argument also shows that $L_2 \cap L_3 = \{I\}$. As a result, the rank of the subgroup of $\overline{\mathcal{P}}_n(\delta+1)$ generated by all the operators of $L_1$, $L_2$ and $L_3$ is the sum of the ranks of the three subgroups rank($L_1$)+rank($L_2$)+rank($L_3$).

It is immediate to see that rank($L_1$)=2n. For a circuit without measurement the rank of $L_2$ is 2nΔ. The constraint associated with the commutation with each measurement decreases the rank by 1, which yields rank($L_2$)=2nΔ−m where m is the number of measurements of the circuit. Finally, the rank of $L_3$ is given by the dimension of the outcome code, that is rank($L_3$)=m−r.

Putting things together this proves that these three sets of operators generate a group with rank 2n(Δ+1)−r which coincides with the value of 2K+R. This proves that this family of operators generate all stabilizer and logical operators.

8.3. Application to the Correction of Circuit Faults

Here, the space-time code is used to show that one can reduce the problem of correcting circuit faults to the correction of Pauli errors in a stabilizer code.

Considered now is a set of checks $u_1, \ldots, u_r$ for the outcome code $\mathcal{O}(\mathcal{C})$ of a Clifford circuit. The syndrome map associated with these checks is denoted $$\sigma_{\mathcal{O}}: \mathbb{Z}_2^m \to \mathbb{Z}_2^r. \tag{57}$$

Recall that the i th syndrome bit of a vector v is $(u_i|v)$. Consider the space-time code $\mathcal{Q}$ ($\mathcal{C}$) with stabilizer generators $\overleftarrow{F(u_1)}, \ldots, \overleftarrow{F(u_r)}$. The corresponding syndrome map is denoted $$\sigma_{\mathcal{Q}}: \overline{\mathcal{P}}_{n(\Delta+1)} \to \mathbb{Z}_2^r \tag{58}$$

and the i th syndrome bit of a Pauli error F is $[\overleftarrow{F(u_i)}, F]$. An MLE decoder is used for the stabilizer code $\mathcal{Q}$ ($\mathcal{C}$), which is a map $$D_{\mathcal{Q}}: \mathbb{Z}_2^r \to \overline{\mathcal{P}}_{n(\Delta+1)} \tag{59}$$

that returns a most likely Pauli error given a syndrome $\sigma_{\mathcal{Q}}(F)$. Considered here is Pauli error according to the distribution $\mathbb{P}_{\mathcal{F}}$ of circuit faults. Finally, recall that the effect of a fault operator F in a circuit is obtained from a map $$\text{eff}: \overline{\mathcal{P}}_{n(\Delta+1)} \to \mathbb{Z}_2^m \times \overline{\mathcal{P}}_n \tag{60}$$

which maps a fault operator onto its effect on the outcome vector and the output state.

Theorem 2. Circuit decoder from stabilizer code decoder. Let $\mathcal{C}$ be a Clifford circuit. If $D_{\mathcal{Q}}$ is a MLE decoder for stabilizer code $\mathcal{Q}$ ($\mathcal{C}$), then $\text{eff} \circ D_{\mathcal{Q}} \circ \sigma_{\mathcal{O}}$ is an MLF circuit decoder for the circuit $\mathcal{C}$.

First a lemma will be proved. Recall that $\rho_M$ denotes the n-qubit maximally mixed state. The indicator function of a set A is denoted $\delta_A$. It takes the value $\delta_A(x)=1$ if $x \in A$ and 0 otherwise.

Lemma 7. Let $\mathcal{C}$ be a Clifford circuit and let F be a fault operator with effect eff(F)=(f,E). If $\mathcal{O}(\mathcal{C})$ is the outcome code of $\mathcal{C}$, then $$\mathbb{P}_{\mathcal{C},\rho_M}^{(F)}(o) = \frac{1}{2^k}\delta_{f+\mathcal{O}(\mathcal{C})}(o) \tag{61}$$

where $k=\dim \mathcal{O}(\mathcal{C})$.

Proof. Consider first the case of a trivial fault operators F=I. Then, from Proposition 4 the set of outcomes o with non-zero probability is a subset of the outcome code $\mathcal{O}(\mathcal{C})$. The mam difference with Proposition 4 is that the input state is restricted to be the maximally mixed state. The unitary operations of the circuit preserve the maximally mixed states and applying a Pauli measurement to the maximally mixed state returns a uniform outcome and the post-measurement state is the maximally mixed state. This proves that all outcome vectors of $\mathcal{O}(\mathcal{C})$ can occur when the input state of the circuit is fixed to be the maximally mixed state $\rho_M$. Moreover, they occur with the same probability. This proves that $$\mathbb{P}_{\mathcal{C},\rho_M}^{(I)}(o) = \frac{1}{2^k}\delta_{\mathcal{O}(\mathcal{C})}(o). \tag{62}$$

Injecting F in the circuit shifts the outcome vector o by f, which leads to the shifted indicator function in the lemma.

Proof. [Proof of Theorem 2] It can be proved that for all $o \in \mathbb{Z}_2^m$, the fault operator $F=\text{eff} \circ D_{\mathcal{Q}} \circ \sigma_{\mathcal{O}}(o)$ maximizes the function $Q_{MLF}(F,o)$ introduced in Eq. (12). Based on Lemma 7, $$Q_{MLF}(F, o) = \frac{1}{2^k}\delta_{f+\mathcal{O}(\mathcal{C})}(o)\mathbb{P}_{\mathcal{F}}(F) \tag{63}$$

which means that one can maximize $Q_{MLF}(F,o)$ by selecting a fault operator F such that $o \in f+\mathcal{O}(\mathcal{C})$ that has maximum probability $\mathbb{P}_{\mathcal{F}}(F)$. The condition $o \in f+\mathcal{O}(\mathcal{C})$ is equivalent to $\sigma_{\mathcal{O}}(f) = \sigma_{\mathcal{O}}(o)$. Finally, Lemma 3, it is known that $\sigma_{\mathcal{O}}(f) = \sigma_{\mathcal{Q}}(F)$. Overall, it was shown that a MLF decoder for the circuit $\mathcal{C}$ is a circuit decoder that returns the effect of a fault operator F such that $\sigma_{\mathcal{Q}}(F) = \sigma_{\mathcal{O}}(o)$ with maximum probability. Therefore the map $\text{eff} \circ D_{\mathcal{Q}} \circ \sigma_{\mathcal{O}}$ is an MLF decoder.

8.4. Beyond MLF Circuit Decoders

An MLF decoder is sometimes good enough but it ignores the fact that two fault operators may have the same effect and two residual errors that differ in an output stabilizer can be considered equivalent.

In some cases one may prefer a most likely coset decoder (MLC decoder), which is defined to be a circuit decoder that takes as an input an outcome vector o and returns a pair $(\hat{f}, \hat{E})$ that maximizes the sum $$Q_{MLC}(\hat{f}, \hat{E}, o) = \sum_{E' \in \hat{E}\langle \mathcal{S}_o \rangle} \sum_{\substack{F \in \mathcal{P}_{n(\Delta+1)} \\ \text{eff}(F) = (\hat{f}, E')}} \mathbb{P}_{\mathcal{C},\rho_M}^{(F)}(o)\mathbb{P}_{\mathcal{F}}(\hat{F}). \tag{64}$$

Therein, $\hat{E}\langle \mathcal{S}_o \rangle$ denotes the coset of $\hat{E}$ in the output stabilizer group. Based on Eq. (13), this sum is proportional with the sum of the probabilities of all the fault operators that leads to an effect $(\hat{f}, E')$ where the Pauli error E' is equivalent to $\hat{E}$ up to a stabilizer of the output code.

One can design a MLC decoder using a subsystem version of the space-time code obtained by gauging logical operators which correspond to faults with trivial effect. Namely, one can define a subsystem code from the gauge group generated by the operators $G(P, \ell)$ where P commutes with all the measurements at level $\ell$ and the operators $\eta\ell_j$ $_{0.5}$ ($S_j$) where $S_j$ is an operator measured at level $\ell_j$. Then, the center of the gauge group is the stabilizer group of the space-time code. Equivalently, the subsystem space-time code can be seen as a variant of the stabilizer space-time code obtained by gauging the logical qubits corresponding to the operators $G(P, \ell)$ such that P commutes with all the measured operators at level $\ell$. This subsystem code can be seen as a generalization of the circuit-to-code construction proposed in [Ref. 1]. Considered here are circuits including intermediate measurements and multi-qubit measurement whereas [Ref. 1] focuses on post-selection circuits.

Then, one could design a MLC decoder from a decoder for the subsystem space-time code that returns a most likely coset of the gauge group. This strategy will not be expanded herein because designing a most likely coset for a subsystem code is generally challenging. In what follows, the focus is on the strategy suggested by Theorem 2 and use of decoders for the stabilizer space-time code.

9. LDPC Space-Time Code

A complete scheme for correction of faults in a Clifford circuit includes a decoder. However, decoding a general code is quite difficult. Indeed, the maximum likelihood decoding problem is NP-hard for linear codes [Ref. 14] and it is #P-hard for stabilizer codes [Ref. 15]. However, some classes of codes such as LDPC codes, which are defined by low-weight checks, admit an efficient decoder with good performance [Ref. 4].

Considered here are restrictions induced by a limited connectivity in the quantum hardware implementing the circuit. This imposes some constraints on the space-time code which in some cases make it easier to decode. The basic idea is to produce a set of low-weight stabilizer generators for the space-time code and to use an LDPC code decoder. In this section is proposed an algorithm that produces low-weight stabilizers for a space-time code.

9.1. Qubit Connectivity and LDPC Space-Time Codes

Because the backpropagation can spread errors through the entire circuit, the check operators $\overleftarrow{F(u)}$ not expected to have low weight. However, if the circuit is implemented with qubits with limited connectivity, the backpropagation does not spread F(u) as fast and one can hope for low-weight check operators. Below are identified sufficient conditions that ensure that the space-time code admit low-weight generators.

A family of stabilizer codes is said to be LDPC if all the stabilizer groups of the codes admit generators acting on O(1) qubits. A family of stabilizer codes is said to be D-dimensional local if the n qubits of the codes can be mapped onto the vertices of a D-dimensional grid $\mathbb{Z}^D$ in such a way that the stabilizer generators are all supported on a ball with radius O(1) in the grid. D-dimensional local codes are a subset of quantum LDPC codes.

The depth of an outcome vector $u \in \mathbb{Z}_2^m$, denoted depth(u) is defined as $$\text{depth}(u) = \max\{\ell_j | u_j=1\} - \min\{\ell_j | u_j=1\} + 1. \tag{65}$$

Recall that $\ell_j$ is the level of the j th measurement of the circuit. The measurements indexed by j satisfying $u_j=1$ are supported in a subset of depth(u) consecutive levels of the circuit $\mathcal{C}$.

A family of circuits is said to be bounded if all the outcomes are codes of the circuits admit a set of checks with weight O(1) and with depth O(1).

Proposition 8. [LDPC space-time codes] Let $(\mathcal{C}_t)_{t \in \mathbb{N}}$ be a family of Clifford circuits. If the family of circuits is bounded and if all circuit operations act on O(1) qubits, then the space-time codes of the circuits are LDPC.

Proof. The stabilizer group of the space-time code is generated by the check operators $\overleftarrow{F(u_i)}$ corresponding to the generators $u_1, \ldots, u_r$ of $\mathcal{O}(\mathcal{C}_t)^\perp$ with bounded depth. By Lemma 8, the stabilizer generators $\overleftarrow{F(u_i)}$ have support on O(1) levels. Moreover, because the circuits are bounded, the weight of F(u) is bounded. Back-propagating F(u) through a circuit made with operations acting on O(1) qubits leads to a bounded weight operator $\overleftarrow{F(u)}$.

Proposition 9. [(D+1)-dimensional space-time codes] Let $(\mathcal{C}_t)_{t \in \mathbb{N}}$ be a family of Clifford circuits acting on qubits placed on a D-dimensional grid $\mathbb{Z}^D$. If the family of circuits is bounded and if all circuit operations act on qubits separated by a distance O(1), then the space-time codes of the circuits are (D+1)-dimensional local.

Proof. By the same argument as in the proof of Proposition 8, the stabilizer generators $\overleftarrow{F(u)}$ are obtained by backpropagation of bounded weight operators F(u). Because the backpropagation goes through local operations in D dimensions, this results in local generators in (D+1) dimensions.

9.2. Stabilizer Group Induced on a Subset of Qubits

A key technical to generate low-weight generators in a space-time code is the following algorithm that produces a set of generators for the operators of a stabilizer group with support included in a given subset of qubits. FIG. 8 shows aspects of an example algorithm for construction of generators for a stabilizer group induced on a subset of qubits.

Described first is a naive solution. Given a stabilizer group $\langle \mathcal{S} \rangle$ with length n and a subset $A \subset \{1, \ldots, n\}$ of the qubits, the objective is to compute a generating set for the subgroup of operators $S \in \langle \mathcal{S} \rangle$ whose support is included in A. Assume that a set of stabilizer generators $\mathcal{S} = S_1, \ldots, S_r$ is given. It suffices to solve the linear system made with the n−|A| equations $$\prod_{i=1}^{r} (S_{i,j})^{\lambda_i} = I \tag{66}$$

in the r variables $\lambda_1, \ldots \lambda_r \in \mathbb{Z}_2$ where $S_{i,j}$ is the j th coefficient of $S_i$ and j varies over $\{1, \ldots, n\} \backslash A$. Using Gaussian elimination, the complexity of this approach is cubic in n.

This may be too slow for large circuits. One can achieve a more favorable complexity in the case of a small subset A using the following proposition. Before describing the solution, some notation will be introduced.

The restriction of a Pauli operator $P \in \overline{\mathcal{P}}$ to a subset of qubits A is the operator $P_{|A}$ obtained by setting all the components of P outside of A to I. The restriction of a subgroup G of $\overline{\mathcal{P}}_n$ to the subset A, denoted $G_{|A}$, is the set that contains the restrictions of all the operators of G. For example, the set of n-qubit Pauli operators supported on a subset A of $\{1, \ldots, n\}$ is $\overline{\mathcal{P}}_{n|A}$.

The following proposition leads a more efficient way to compute the restriction of a stabilizer group to a subset of qubits. Recall the notation $G^\perp$ for the set of Pauli operators that commutes with the operators included in the subset G of $\overline{\mathcal{P}}_n$. For a stabilizer code $\mathcal{S}$, the set $\mathcal{S}^\perp$ is the set of logical operators of the code.

Proposition 10. [Induced stabilizer subgroup] Let $\langle \mathcal{S} \rangle$ be a stabilizer code with length n with stabilizer generators $\mathcal{S} = \{S_1, \ldots, S_r\}$ and logical operators $X_1, Z_1 \ldots, X_k, Z_k$. Let $A \subset \{1, \ldots, n\}$. A pauli operator P with support included in A is a stabilizer iff it commute with the restricted operators $S_{1|A}, \ldots, S_{r|A}, X_{1,A}, Z_{1,A}, \ldots, X_{k,A}, Z_{k,A}$.

Proof. A Pauli operator P belongs to the stabilizer group $\langle S \rangle$ iff it commutes with all the stabilizer generators and logical operators of the code, that is iff [P,L]=0 for all L∈ $S^\perp$. In the case of a Pauli operator P with support included in A, $[P|L]=[P|L_{|A}]+[P|L_{|A^c}]$ and it will be known that $[P|L_{|A^c}]$ is always trivial, thus proving the proposition.

Based on Proposition 10, one may design Algorithm 2 which returns a set of generators for the restriction of a stabilizer group to a subset of qubits. If each qubit is acted on by O(1) stabilizer generators $S_i$ and O(1) logical operators, the matrix G obtained at the end of line 2 has size $O(A) \times O(|A|)$ and it can be constructed in $O(|A|^2)$ bit operations. Then, the most expansive subroutine of Algorithm 2 is the transformation of the matrix G in standard form which can be done in $O(|A|^3)$ bit operations using Gaussian elimination as in [Ref. 3].

9.3. Construction of Low-Weight Generators for the Space-Time Code

To make sure that one can efficiently decode the space-time code, a set of low-weight stabilizer generators is useful. FIG. 9 shows aspects of an example algorithm for construction of low weight stabilizers of a space-time code.

To find a set of low-weight generators for a given stabilizer group, one could apply Algorithm 2 to all the subsets of ω qubits with ω=1, 2, . . . until enough generators are obtained to span the full stabilizer group. One could speed-up this search using information sets for Pauli groups [Ref. 3] but the cost remains discouraging for general stabilizer codes. In this section, it is shown that one can use some information about the structure of space-time code to help probe the right subsets of qubits and generate low-weight stabilizer generators.

The space-time graph of a circuit is a graph with vertex set $V=\{1, \ldots, n\} \times \{0.5, 1.5, \ldots, \Delta-0.5\}$ corresponding to the qubits supporting the fault operators except the last level. The edges of the space-time graph are constructed by looping over all the operations of the circuit and for each operation with level $\ell$ acting on qubits $q_{i_1}, \ldots, q_{i_\omega}$, one may connect together all the qubits of the form (q, $\ell$ −0.5) or (q, $\ell$ '+0.5). An operation acting on ω qubits induces a clique with 2ω vertices supported on level $\ell$ −0.5 and $\ell$ +0.5. If the circuit is made with operations acting on at most ω qubits, the maximum degree of the space-time graph is upper bounded by 2(2ω−1).

A stabilizer of a stabilizer code is said to be connected if its support is a connected in the space-time graph. Hereinafter it is proved in Proposition 13 that the restriction of a stabilizer of the space-time code to any connected component of its support is a stabilizer. This proves that stabilizers of the space-time code can be decomposed as products of connected stabilizers. Instead of running over all subsets of qubits, Algorithm 3 returns all the connected stabilizers of a space-time code by running over the neighborhoods of vertices in the space time graph.

Proposition 11. Let $C$ be a Clifford circuit. Then Algorithm 3 returns all the connected stabilizers of the space time code with weight up to M.

In the case of a circuit acting on n qubits, with depth Δ, made with operations acting on at most ω qubits, Algorithm 3 explores nΔ subsets A of qubits with size at most |A|≤1+ $\sum_{i=1}^{\lfloor M/2 \rfloor} \delta(\delta-1)^{i-1}$. where δ=2(2ω−1) is the degree of the space-time graph.

The proof of Proposition 11 provided below relies on Proposition 13

Proof. Any connected stabilizer is supported on a connected subgraph of the space-time graph. As a result, any connected stabilizer with weight≤M is included in a ball with radius $\lfloor M/2 \rfloor$ of the space-graph. This guarantees that it will be discovered by Algorithm 3.

In Algorithm 3 are computed all the operators with weight up to M that belong to a subgroup $S$ (A) of the Pauli group. If the subgroup is small, one can proceed by brute force and run over all the elements of $S$ (A). Otherwise, one can speed-up this subroutine using information sets for Pauli groups as in [Ref. 3].

10. Applications

In this section is combined all the ingredients developed in this disclosure to produce a flexible scheme for the correction of circuit faults in Clifford circuits. The full protocol is explained in FIG. 4.

10.1. Standard Design Procedure for a Quantum Error Correction Scheme

To emphasize the advantage of this approach, the general approach to designing and simulating a quantum error correction scheme will first be reviewed. For simplicity, the focus is on stabilizer codes, and the standard circuit noise model reviewed in Section 4 is assumed.

To describe a complete quantum error correction scheme for a given stabilizer code, one must design the following components:
1. Syndrome extraction circuit: A quantum circuit that takes as an input a noisy encoded state and returns a bit string.
2. Syndrome map: A classical procedure that takes as an input the outcome of the syndrome extraction circuit and returns bit string called a syndrome.
3. Decoder: A classical procedure that takes as an input the syndrome and that returns a correction to apply to the encoded state.

For example, in the case of the surface code, one can consider the standard syndrome extraction circuit [Ref. 10] made with d rounds of plaquette measurements where each round extracts the outcome of all the plaquettes in depth 6 (one rounds of ancilla preparation, four rounds of CNOTs and 1 round of ancilla measurement). To obtain the syndrome from this circuit outcome, one computes the XOR of the outcome vectors obtained in consecutive rounds of plaquette measurements to produce a syndrome. Then, the syndrome is fed to a surface code decoder such as the Minimum Weight Perfect Matching decoder [Ref. 9] or the Union-Find decoder [Ref. 16].

10.2. Automated Circuit Fault Correction

Proposed here is a protocol described in FIG. 4 for the correction of faults in a Clifford circuit $C$ that uses only the Clifford circuit as an input instead of the three components required in the previous section.

Consider a circuit $C$ with m measurements. The first step of the protocol is the computation of a set of outcome checks $u_1, \ldots, u_r \in \mathbb{Z}_2^m$ using Algorithm 1. In the absence of faults, running the circuit $C$ produces an outcome vector $o \in \mathbb{Z}_2^m$ that satisfy $(o|u_1) = \ldots = (o|u_r) = 0$. Therefore, one can use these values to detect and correct circuit faults. Moreover, the set of outcome checks returned by Algorithm 1 is maximal. It fully describes the set of possible outcomes for the circuit, which means that one is using all the information available to detect and correct faults.

Given the outcome checks, it is a syndrome map and a decoder are to be constructed in order to transform the check values $(o|u_i)$ into a correction to apply to the output state of the circuit. For small circuits, this can be done with the syndrome map $d \mapsto \sigma$ where $\sigma_i = (o|u_i)$ and a lookup decoder. Naively, one can construct a lookup decoder for the circuit $\mathcal{C}$ using the outcome checks $u_i$ as follows. The method loops over all the fault configurations of the circuit with up to M faults for some integer M. For each fault configuration F, it computes the syndrome value induced by F and stores a configuration made with a minimum number of faults for each syndrome $\sigma$.

Thanks to Theorem 2, one can import tools from the stabilizer formalism to apply them to the correction of circuit faults. For instance, one can use the construction of a lookup decoder for stabilizer codes proposed in [Ref. 3] to produce a lookup decoder for the space-time code of the circuit and use it to correct circuit faults.

Lookup decoders are impractical for large system sizes. To make the decoding of large circuit possible, one must restrict the set of schemes considered because the decoding problem for linear code and stabilizer code is generally intractable [Ref. 14], [Ref. 15]. The focus now is on the case of circuit that admits local redundancy in the sense that the space-time code associated with the circuit has many weight stabilizers. This assumption is even more justified because the value of an outcome check corresponding to a large weight stabilizer in the space-time code will be very noisy and unreliable.

After computing the outcome checks $u_1, \ldots, u_r$ using Algorithm 1, one may compute the corresponding stabilizers $\overleftarrow{F(u_1)}, \ldots, \overleftarrow{F(u_r)}$. Then Algorithm 3 is run to produce a set low-weight stabilizer generators for the space-time code. These generators define a new syndrome map whose components are related to the check values $(o|u_i)$ by a linear map. A set of low-weight generators is now available, and one may use any LDPC code decoder for this code.

In these simulations, the Union-Find decoder is considered, which can be used for local topological codes [Ref. 16] or for LDPC codes [Ref. 7]. Alternatively, one could consider other decoding strategies such as the Renormalization Group decoder [Ref. 8] for topological codes or a Belief Propagation decoder for LDPC codes [Ref. 5], [Ref. 6].

To estimate the performance of a quantum error correction scheme, it is common to assume that the simulation ends with a perfect round of measurement of the stabilizers of the code. This can be done in the current setting by appending the circuit with noiseless measurements of a set of stabilizer generators of the output state of the circuit.

Similarly, if simulating the performance of an input circuit acting on a state living in a stabilizer code is desired, then one can prepend a round of noiseless measurement of a set of stabilizer generators of the input code to the circuit.

11. Recap, Outlook, and References

Proposed herein is a versatile strategy for the correction of circuit faults in Clifford circuits based on the reduction of this problem to the correction of a stabilizer code. The main advantage of this approach is its flexibility. It applies to any Clifford syndrome extraction circuit, including the syndrome extraction circuits of topological codes and Floquet codes and it also applies to general Clifford circuits which are not necessarily based on a quantum code.

This scheme can be used to automatically generate low-weight checks in Clifford circuits. Alternatively, one could use this as a compilation tool allowing to detect and remove redundancy in Clifford circuit. Adapting Algorithm 1 for this task is immediate.

For additional context, the interested reader is referred to the following references, which are hereby incorporated by reference herein, for all purposes.

[Ref. 1] Dave Bacon, Steven T. Flammia, Aram W. Harrow, and Jonathan Shi. Sparse quantum codes from quantum circuits. In *Proceedings of the forty-seventh annual ACM symposium on Theory of Computing*, 327-334, 2015.

[Ref. 2] Sergey Bravyi and Alexei Kitaev. Universal quantum computation with ideal Clifford gates and noisy ancillas. *Physical Review A*, 71(2):022316, 2005.

[Ref. 3] Nicolas Delfosse, Adam Paetznick, and Alexander Vaschillo. Lookup decoders for stabilizer codes, 2022.

[Ref. 4] Robert Gallager. Low-density parity-check codes. *IRE Transactions on information theory*, 8(1):21-28, 1962.

[Ref. 5] Pavel Panteleev and Gleb Kalachev. Degenerate quantum LDPC codes with good finite length performance. *Quantum*, 5, 585, 2021.

[Ref. 6] Joschka Roffe, David R. White, Simon Burton, and Earl Campbell. Decoding across the quantum low-density parity-check code landscape. *Physical Review Research*, 2(4), 2020.

[Ref. 7] Nicolas Delfosse, Vivien Londe, and Michael E. Beverland. Toward a Union-Find decoder for quantum LDPC codes. In *IEEE Transactions on Information Theory*, IEEE, 2022.

[Ref. 8] Sergey Bravyi, and Jeongwan Haah. Quantum self-correction in the 3d cubic code model. *Physical review letters*, 111(20):200501, 2013.

[Ref. 9] Eric Dennis, Alexei Kitaev, Andrew Landahl, and John Preskill. Topological quantum memory. *Journal of Mathematical Physics*, 43(9):4452-4505, 2002.

[Ref. 10] Austin G. Fowler, Matteo Mariantoni, John M. Martinis, and Andrew N. Cleland. Surface codes: Towards practical large-scale quantum computation. *Physical Review A*, 86(3):032324, 2012.

[Ref. 11] Hector Bombin and Miguel Angel Martin-Delgado. Topological quantum distillation. *Physical review letters*, 97(18):180501, 2006.

[Ref. 12] Rui Chao, Michael E. Beverland, Nicolas Delfosse and Jeongwan Haah. Optimization of the surface code design for majorana-based qubits. *Quantum*, 4:352, 2020.

[Ref. 13] Matthew B. Hastings and Jeongwan Haah. Dynamically generated logical qubits. *Quantum*, 5:564, 2021.

[Ref. 14] Elwyn Berlekamp, Robert McEliece, and Henk Van Tilborg. On the inherent intractability of certain coding problems (corresp.). *IEEE Transactions on Information Theory*, 24(3):384-386, 1978.

[Ref. 15] Pavithran Iyer and David Poulin. Hardness of decoding quantum stabilizer codes. *IEEE Transactions on Information Theory*, 61(9):5209-5223, 2015.

[Ref. 16] Nicolas Delfosse, and Naomi H. Nickerson. Almost-linear time decoding algorithm for topological codes. *Quantum*, 5:595, 2021.

12. Levels Supporting a Check Operator

It is proved in this section that the support of a check operator is related to the support of the measurements involved in the corresponding check of the outcome code.

Lemma 8. Let $u \in \mathcal{O}(\mathcal{C})^\perp$ be a non-zero vector. Denote by $\ell_u$ (respectively $\ell'_u$) the minimum (respectively maximum) level of a measured operator $S_j$ with $u_j=1$. If $\ell < \ell_u$ or $\ell \geq \ell'_u$ then $\overleftarrow{F(u)}_{\ell+0.5} = I$.

Proof. By definition of $\ell'_u$, for all $\ell \geq \ell'_u$ the component $F(u)_{\ell+0.5}$ is trivial. Applying Proposition 2, this shows that $\overleftarrow{F(u)}_{\ell+0.5}$ is also trivial for all $\ell \geq \ell'_u$.

Assume now that $\ell=0$. It is known from Lemma 5 that $\overleftarrow{F(u)}$ commutes with all fault operators $\eta_{0.5}(P)$ supported on level 0.5. Because P can be any operator of $\overline{\mathcal{P}}_n$, this implies $\overleftarrow{F(u)}_{0.5} = I$.

Consider now the case $\ell < \ell_u$; it will be proved that $\overleftarrow{F(u)}_{\ell+0.5})_{\ell|0.5} = \overleftarrow{F(u)}_{0.5}$ which is the identity. Applying Proposition 2, $$\overleftarrow{F(u)}_{0.5} = \prod_{j=\ell}^{\Delta}(U_{0,j}^{-1} F_{j+0.5} U_{0,j}) \tag{67}$$

because for all $j < \ell$, $F(u)_{j+0.5} = I$. Using Eq. (17), $U_{0,j} = U_{\ell,j} U_{0,\ell}$ for all $j \leq \ell$ which yields $$\overleftarrow{F(u)}_{0.5} = \prod_{j=\ell}^{\Delta}((U_{\ell,j}U_{0,\ell})^{-1} F_{j+0.5} U_{\ell,j} U_{0,\ell}) \tag{68}$$

$$= U_{0,\ell}^{-1} \prod_{j=\ell}^{\Delta}(U_{\ell,j}^{-1} F_{j+0.5} U_{\ell,j}) U_{0,\ell} \tag{68}$$

$$= U_{0,\ell}^{-1} \overleftarrow{F(u)}_{\ell+0.5} U_{0,\ell}. \tag{70}$$

Because $\overleftarrow{F(u)}_{0.5\ 0.5}$ is trivial, this relation implies $\overleftarrow{F(u)}_{\ell-0.5} = U_{0,\ell} U_{0,\ell}^{-1} \overleftarrow{F(u)}_{0.5} = I$.

13. Alternative Definition of the Check Operators

One may prefer to use only the propagation instead of both propagation and back-propagation. Here, it is shown that one can obtain the check operators by propagating forward the fault operators F'(u) defined in Section 7.

Proposition 12. If $u \in \mathcal{O}(\mathcal{C})^\perp$, then, $$\overleftarrow{F(u)} = \overrightarrow{F'(u)}. \tag{71}$$

First a lemma will be proved.

Lemma 9. Let $u \in \mathbb{Z}_2^m$. If $\overleftarrow{F(u)}_{0.5} = I$ then $$\overleftarrow{F(u)} = \overrightarrow{F'(u)}. \tag{72}$$

Proof. It will be proved by induction that $\overleftarrow{F(u)}_{\ell+0.5} = \overrightarrow{F'(u)}_{\ell+0.5}$ for all level $\ell$, For $\ell=0$, $\overleftarrow{F(u)}_{0.5} = I$ by assumption and by definition of the propagation $\overrightarrow{F'(u)}_{0.5} = I$.

Assume that the result is true for level $\ell-1 < \Delta$. Using Proposition 2, $$\overrightarrow{F(u)}_{\ell+0.5} = U_\ell \overrightarrow{F(u)}_{\ell-0.5} U_\ell^{-1} F(u)_{\ell+0.5} \tag{73}$$

and $$\overleftarrow{F(u)}_{\ell-0.5} = U_\ell^{-1} \overleftarrow{F(u)}_{\ell-0.5} U_\ell F(u)_{\ell-0.5}. \tag{74}$$

Using the induction hypothesis, one can replace $\overrightarrow{F'(u)}_{\ell-0.5}$ by $\overleftarrow{F(u)}_{\ell-0.5}$ in Eq. (73) and one may use Eq. (74) for the value of $\overleftarrow{F(u)}_{\ell-0.5}$. This leads to the equation $$\overrightarrow{F'(u)}_{\ell+0.5} = U_\ell \overleftarrow{F(u)}_{\ell-0.5} U_\ell^{-1} F'(u)_{\ell+0.5} \tag{75}$$

$$= U_\ell U_\ell^{-1} \overleftarrow{F(u)}_{\ell+0.5} U_\ell F(u)_{\ell-0.5} U_\ell^{-1} F'(u)_{\ell+0.5} \tag{76}$$

$$= \overleftarrow{F(u)}_{\ell+0.5} U_\ell F(u)_{\ell-0.5} U_\ell^{-1} F'(u)_{\ell+0.5} \tag{77}$$

By definition of $U_\ell$ acts trivially on $F(u)_{\ell-0.5}$ implying $U_\ell F(u)_{\ell-0.5} U_\ell^{-1} = F(u)_{\ell-0.5}$. Injecting this in the previous equation produces $$\overrightarrow{F(u)}_{\ell+0.5} = \overleftarrow{F(u)}_{\ell-0.5} F(u)_{\ell-0.5} F'(u)_{\ell+0.5} \tag{78}$$

which leads to $\overrightarrow{F(u)}_{\ell+0.5} = \overleftarrow{F(u)}_{\ell-0.5}$ because $F(u)_{\ell-0.5} = F'(u)_{\ell|0.5}$ by definition.

Proof. [Proof of Proposition 12] By Lemma 5, it is Known that $\overleftarrow{F(u)}_{0.5}$ commutes with all Pauli operators $P \in \overline{\mathcal{P}}_n$. The only Pauli operator that satisfies this property is $\overleftarrow{F(u)}_{0.5} = I$. Therefore, the operator $\overleftarrow{F(u)}$ satisfies the assumption of Lemma 9 which proves the Proposition.

14. The Connected Components of a Stabilizer of the Space-Time Code

The proof of proposition 11 relies on the following proposition. The proof of this proposition relies on lemmas proven after the proposition.

Proposition 13. Let S be a stabilizer for a space-time code. The restriction $S_{|\kappa}$ of S to a connected component $\kappa$ of the support of S in the space-time graph is a stabilizer of the space-time code.

Proof. Based on lemma 10, the restriction S, can be written as $\overleftarrow{F(v)}$ for some vector v. To show that this is a stabilizer of the space-time code, it must be shown that $v \in \mathcal{O}(\mathcal{C})^\perp$. Denote by $\ell'_v$ the maximum level of a measured operator $S_j$ of the circuit such that $v_j=1$. The product of the measured operators indexed by v at level $\ell'_v$ is $F(v))_{\ell'_v-0.5}$.

By Lemma 11, this operator is equal to $\overrightarrow{F'(v)}_{\ell'_v\ 0.5}$. This is a stabilizer for the output of the circuit $\mathcal{C}[\ell'_v-1]$ based on Lemma 12 (recall that $\mathcal{C}[\ell'_v]$ is the su circuit containing all the operations of $\mathcal{C}$ with level $\leq \ell'_v$). This implies that, in the absence of circuit faults, the outcomes of the measurements of the operators $S_j$ with $v_j=1$ have a fixed parity 0, which means that $(o|v)=0$ for all $o \in \mathcal{O}(\mathcal{C})$. This proves the proposition.

Lemma 10. Let $\mathcal{C}$ be a Clifford circuit with m measurements. Let S be a stabilizer for a space-time code. One may decompose S as $$S = \prod_i \overleftarrow{F(u(i))} \qquad (79)$$

where $u(i) \in \mathbb{Z}_2^m$. Moreover, the support of the operators $\overleftarrow{F(u(i))}$ have disjoint supports.

Proof. One may decompose S as $$S = \prod_i S_{|\kappa_i} \qquad (80)$$

where $\kappa_1, \kappa_2, \ldots$ are the connected components of the support of S in the space-time graph. By construction, the operators $S_{|\kappa_i}$ have disjoint support.

Because it is a stabilizer, the operator S is of the form $\overleftarrow{F(u)}$ with $u \in \mathcal{O}(\mathcal{C})^\perp$. Given a measured operator $S_j$ of the circuit with level $\ell_j$, define $V(S_j)$ to be the set of vertices of space-time graph of the form ($\ell_j \pm 0.5$, q) where q is a qubit of support of $S_j$. Define the vector $u(i) \in \mathbb{Z}_2^m$ to be the restriction of u to the set of coordinates j such that the circuit operation $V(S_j)$ overlaps with $\kappa_i$. Because it is a clique of the space-time graph, a set $V(S_j)$ can only overlap with a single connected component $\kappa_i$. Therefore, u can be decomposed as $u = \Sigma_i u(i)$ and the vectors u(i) do not overlap. Applying Proposition 5, this yields $$\overleftarrow{F(u)} = \prod_i \overleftarrow{F(u(i))}. \qquad (81)$$

Now it will be shown that the support of $\overleftarrow{F(u(i))}$ is the component $\kappa_i$. By definition of the backpropagation, if a qubit $Q = (\ell = 0.5, q)$ belongs to the support of $\overleftarrow{F(u(i))}$, there must exists a path in this support that connects Q to a set $V(S_j)$ for some $j \in \text{supp}(u(i))$ (otherwise one cannot reach Q by back-propagating F(u(i))). By definition of the set u(i), the proves that the qubit Q is part of the connected component $\kappa_i$. This shows that $\text{supp}(\overleftarrow{F(u(i))}) = \kappa_i$ which implies $\overleftarrow{F(u(i))} = S_{\kappa_i}$ and leads to the decomposition claimed in the lemma.

Lemma 11. Let $\mathcal{C}$ be a Clifford circuit with depth $\Delta$ and with m measurements. Let $v \in \mathbb{Z}_2^m$. If $\overleftarrow{F(v)}_{0.5} = I$, then $$F(v)_{\ell'_v - 0.5} = \overrightarrow{F'(v)}_{\ell'_v\ 0.5} \qquad (82)$$

where $\ell'_v$ is the maximum level of a measured operator $S_j$ with $v_j = 1$.

Proof. By definition, level $\ell'_v - 0.5$ is the largest non-trivial level of $\overleftarrow{F(v)}$ and for this level $$\overleftarrow{F(v)}_{\ell'_v - 0.5} = F(v)_{\ell'_v\ 0.5}. \qquad (83)$$

Combining this with Lemma 9 this proves result.

In the following lemma $\mathcal{C}[\ell]$ denotes the subcircuit of $\mathcal{C}$ that contains all the operations of $\mathcal{C}$ with level $\leq \ell$.

Lemma 12. Let $\mathcal{C}$ be a Clifford circuit with depth $\Delta$ and with m measurements. Let $u \in \mathcal{O}(\mathcal{C})^\perp$ and let $v \in \mathbb{Z}_2^m$ such that $\overleftarrow{F(v)}$ is the restriction of $\overleftarrow{F(u)}$ to one of a connected component of its support in the space-time graph. Then for all $\ell = 1, \ldots \Delta$, the operator $\overrightarrow{F'(v)}_{\ell+0.5}$ belongs to output stabilizer group of the subcircuit $\mathcal{C}[\ell]$.

Proof. This result will be proved by induction on $\ell$.

For $\ell = 1$, the result holds because the stabilizer group of the output of the subcircuit $\mathcal{C}[1]$ is generated by the measured operators at level 1 and $\overrightarrow{F'(v)}_{1.5} = F'(v)_{1.5}$ is a product of measured operators at level 1.

Assume now that $\overrightarrow{F'(v)}_{\ell-0.5}$ is a stabilizer of the output state of the circuit $\mathcal{C}[\ell-1]$ and it will be proved that the result is true at level $\ell$.

The measurements performed at level $\ell$ do not affect the stabilizer $\overrightarrow{F'(v)}_{\ell-1|0.5}$ of the circuit because it commutes with these measurements. Indeed, consider a measured operator M of the level $\ell$. From Lemma 4, it is known that $[\eta)_{\ell-0.5}(M), \overleftarrow{F(u)}] = 0$ because $\overleftarrow{F(u)}$ is a stabilizer of the space-time code. This equation leads to $[M, \overleftarrow{F(u)}_{\ell-0.5}] = 0$ and $[M, \overrightarrow{F'(u)}_{\ell-0.5}] = 0$ using Lemma 9. By definition of the space-time graph of the circuit, the operation M can only overlap with at most one of the connected component of the $\overrightarrow{F'(u)}$. Therefore, $[M, \overrightarrow{F'(u)}_{\ell-0.5}] = 0$. This proves that the stabilizer $\overrightarrow{F'(u)}_{\ell-0.5}$ commutes with all the operators measured at level $\ell$. As a result, it is still a stabilizer after applying these measurements. Moreover, the measured operators are also stabilizers.

Consider now the effect of the unitary operations. The unitary operations of level $\ell$ induce a conjugation of the stabilizers by $U_\ell$ which is the product of all unitary operations at level $\ell$. This maps the stabilizer $\overrightarrow{F'(v)}_{\ell-1-0.5}$ onto $$U_\ell \overrightarrow{F'(v)}_{\ell-1+0.5} U_\ell^\dagger = \prod_{j=0}^{\ell-1} U_{j,\ell} F'(v)_{j+0.5} U_{j,\ell}^{-1}. \qquad (84)$$

Moreover, it is known that $F'(v)_{\ell+0.5}$ is a stabilizer because it is a product of measured operators at level $\ell$. Multiplying the stabilizer obtained Eq. (84) with $F'(v)_{\ell-0.5}$ the stabilizer $\overrightarrow{F'(v)}_{\ell|0.5}$ for the output of the circuit $\mathcal{C}[\ell]$.

15. Classical Computer System and Additional Description

The methods herein may be tied to a computer system of one or more computing devices. Such methods and processes may be implemented as an application program or service, an application programming interface (API), a library, and/or other computer-program product.

Figure 10:
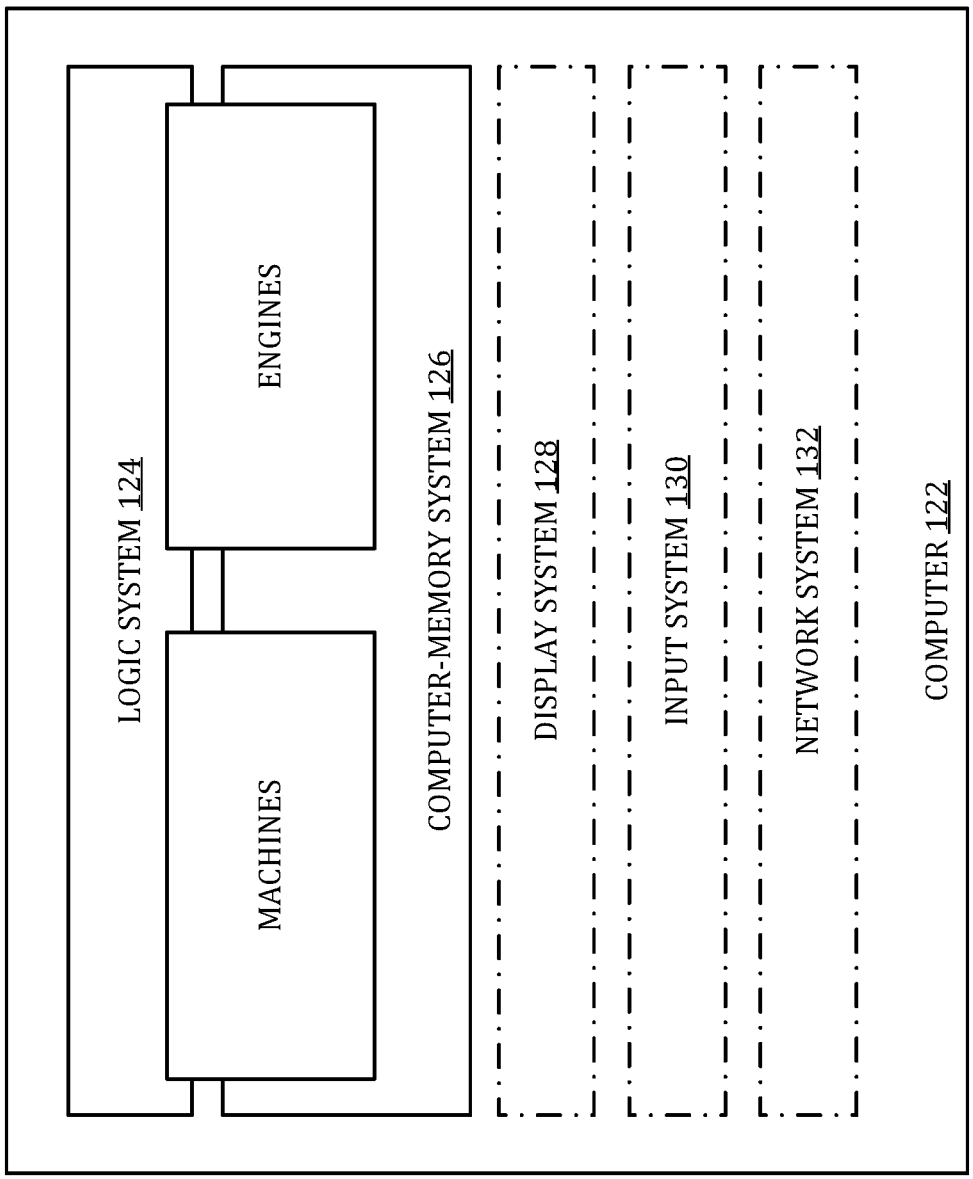
FIG. 10 shows aspects of an example classical computer system.

FIG. 10 provides a schematic representation of a classical computer 122 configured to provide some or all of the classical computer system functionality disclosed herein. Classical computer 122 may take the form of a personal computer, application-server computer, or any other computing device.

Classical computer 122 includes a logic system 124 and a computer-memory system 126. Classical computer 122 may optionally include a display system 128, an input system 130, a network system 132, and/or other systems not shown in the drawings.

Logic system 124 includes one or more physical devices configured to execute instructions. For example, the logic system may be configured to execute instructions that are part of at least one operating system (OS), application, service, and/or other program construct. The logic system may include at least one hardware processor (e.g., microprocessor, central processor, central processing unit (CPU) and/or graphics processing unit (GPU)) configured to execute software instructions. Additionally or alternatively, the logic system may include at least one hardware or firmware device configured to execute hardware or firmware instructions. A processor of the logic system may be single-core or multi-core, and the instructions executed thereon may be configured for sequential, parallel, and/or distributed processing. Individual components of the logic system optionally may be distributed among two or more separate devices, which may be remotely located and/or configured for coordinated processing. Aspects of the logic system may be virtualized and executed by remotely-accessible, networked computing devices configured in a cloud-computing configuration.

Computer-memory system 126 includes at least one physical device configured to temporarily and/or permanently hold computer system information, such as data and instructions executable by logic system 124. When the computer-memory system includes two or more devices, the devices may be collocated or remotely located. Computer-memory system 126 may include at least one volatile, nonvolatile, dynamic, static, read/write, read-only, random-access, sequential-access, location-addressable, file-addressable, and/or content-addressable computer-memory device. Computer-memory system 126 may include at least one removable and/or built-in computer-memory device. When the logic system executes instructions, the state of computer-memory system 126 may be transformed—e.g., to hold different data.

Aspects of logic system 124 and computer-memory system 126 may be integrated together into one or more hardware-logic components. Any such hardware-logic component may include at least one program- or application-specific integrated circuit (PASIC/ASIC), program- or application-specific standard product (PSSP/ASSP), system-on-a-chip (SOC), or complex programmable logic device (CPLD), for example.

Logic system 124 and computer-memory system 126 may cooperate to instantiate one or more logic machines or engines. As used herein, the terms 'machine' and 'engine' each refer collectively to a combination of cooperating hardware, firmware, software, instructions, and/or any other components that provide computer system functionality. In other words, machines and engines are never abstract ideas and always have a tangible form. A machine or engine may be instantiated by a single computing device, or a machine or engine may include two or more subcomponents instantiated by two or more different computing devices. In some implementations, a machine or engine includes a local component (e.g., a software application executed by a computer system processor) cooperating with a remote component (e.g., a cloud computing service provided by a network of one or more server computer systems). The software and/or other instructions that give a particular machine or engine its functionality may optionally be saved as one or more unexecuted modules on one or more computer-memory devices.

Machines and engines may be implemented using any suitable combination of machine learning (ML) and artificial intelligence (AI) techniques. Non-limiting examples of techniques that may be incorporated in an implementation of one or more machines include support vector machines, multi-layer neural networks, convolutional neural networks (e.g., spatial convolutional networks for processing images and/or video, and/or any other suitable convolutional neural network configured to convolve and pool features across one or more temporal and/or spatial dimensions), recurrent neural networks (e.g., long short-term memory networks), associative memories (e.g., lookup tables, hash tables, bloom filters, neural Turing machines and/or neural random-access memory) unsupervised spatial and/or clustering methods (e.g., nearest neighbor algorithms, topological data analysis, and/or k-means clustering), and/or graphical models (e.g., (hidden) Markov models, Markov random fields, (hidden) conditional random fields, and/or AI knowledge bases)).

When included, display system 128 may be used to present a visual representation of data held by computer-memory system 126. The visual representation may take the form of a graphical user interface (GUI) in some examples. The display system may include one or more display devices utilizing virtually any type of technology. In some implementations, display system may include one or more virtual-, augmented-, or mixed reality displays.

When included, input system 130 may comprise or interface with one or more input devices. An input device may include a sensor device or a user input device. Examples of user input devices include a keyboard, mouse, or touch screen.

When included, network system 132 may be configured to communicatively couple classical computer 122 with one or more other computer systems. The network system may include wired and/or wireless communication devices compatible with one or more different communication protocols. The network system may be configured for communication via personal-, local- and/or wide-area networks.

In conclusion, one aspect of this disclosure is directed to a method to correct a fault in application of a Clifford circuit to a qubit register of a quantum computer, the method comprising: receiving circuit data defining the Clifford circuit; emitting outcome code based on the circuit data, the outcome code including a series of outcome checks each corresponding to an anticipated error syndrome of the application of the Clifford circuit to the qubit register; and emitting space-time quantum code corresponding to the Clifford circuit based on the circuit data and on the outcome code, the space-time quantum code including a series of check operators that support quantum-error correction, thereby enabling fault correction in the application of the Clifford circuit to the qubit register. One technical benefit this provides is that the problem of circuit-fault correction is reduced to the more tractable problem of error correction in quantum code.

In some implementations the Clifford circuit includes one or more Clifford gates. In some implementations the Clifford circuit includes one or more Pauli measurements. In some implementations the Clifford circuit includes redundant measurements. In some implementations the Clifford circuit is an error-syndrome extraction circuit. In some implementations the space-time quantum code is a quantum-stabilizer code. This provides an additional technical benefit of ensuring that the various output syndromes of the space-time quantum code can be handled according to stabilizer-decoder procedures. In some implementations each of the check operators is a stabilizer generator of the space-time quantum code, and measurement of each stabilizer generator returns a result of a corresponding outcome check of the outcome code. In some implementations the method further comprises: building a lookup decoder for the space-time quantum code; and decoding the space-time quantum code via the lookup decoder to correct the fault in the application of the Clifford circuit to the qubit register. This provides an additional technical benefit of enabling correction of the circuit fault, to thereby reduce or eliminate the error in the quantum circuit and achieve a more accurate computation. In some implementations the method further comprises: emitting low-density parity-check (LDPC) space-time quantum code based on the circuit data, the outcome code, and the space-time quantum code, the LDPC space-time quantum code including connected stabilizers of the space-time quantum code up to a predetermined weight; and decoding the LDPC space-time quantum code in an LDPC decoder to correct the fault in the application of the Clifford circuit to the qubit register. This provides an additional technical benefit of enabling correction of the circuit fault, to thereby reduce or eliminate the error in the quantum circuit and achieve a more accurate computation. In some implementations emitting the LDPC space-time quantum code comprises receiving the space-time quantum code in D dimensions and producing local stabilizer generators in D+1 dimensions. In some implementations emitting the LDPC space-time quantum code comprises: constructing a space-time graph of the Clifford circuit; and constructing a set of stabilizer generators of the space-time code that are supported on local regions of the space-time graph.

Another aspect of this disclosure is directed to a computer system coupled operatively to a quantum computer, the computer system comprises a processor and, operatively coupled to the processor, computer memory holding instructions that cause the processor to correct a fault in application of a Clifford circuit to a qubit register of the quantum computer. The instructions comprise: instructions (A) for receiving circuit data defining the Clifford circuit; instructions (B) for emitting outcome code based on the circuit data, the outcome code including a series of outcome checks each corresponding to an anticipated error syndrome of the application of the Clifford circuit to the qubit register; and instructions (C) for emitting space-time quantum code corresponding to the Clifford circuit based on the circuit data and the outcome code, the space-time quantum code including a series of check operators that support quantum-error correction, thereby enabling fault correction in the application of the Clifford circuit to the qubit register. One technical benefit this provides is that the problem of circuit-fault correction is reduced to the more tractable problem of error correction in quantum code.

In some implementations the Clifford circuit includes redundant measurements. In some implementations the Clifford circuit is an error-syndrome extraction circuit. In some implementations the space-time quantum code is a quantum-stabilizer code. In some implementations each of the check operators is a stabilizer generator of the space-time quantum code, and wherein measurement of each stabilizer generator returns a result of a corresponding outcome check of the outcome code. This provides an additional technical benefit of ensuring that the various output syndromes of the space-time quantum code can be handled according to stabilizer-decoder procedures. In some implementations the computer system further comprises: instructions for emitting low-density parity-check (LDPC) space-time quantum code based on the circuit data, the outcome code, and the space-time quantum code, the LDPC space-time quantum code including connected stabilizers of the space-time quantum code up to a predetermined weight; and instructions for decoding the LDPC space-time quantum code in an LDPC decoder to correct the fault in the application of the Clifford circuit to the qubit register. This provides an additional technical benefit of enabling correction of the circuit fault, to thereby reduce or eliminate the error in the quantum circuit and achieve a more accurate computation. In some implementations emitting the LDPC space-time quantum code comprises receiving the space-time quantum code in D dimensions and producing local stabilizer generators in D+1 dimensions. In some implementations emitting the LDPC space-time quantum code comprises: constructing a space-time graph of the Clifford circuit; and constructing a set of stabilizer generators of the space-time code that are supported on local regions of the space-time graph.

Another aspect of this disclosure is directed to a method to correct a fault in application of a Clifford circuit to a qubit register of a quantum computer, the method comprising: receiving circuit data defining the Clifford circuit; emitting outcome code based on the circuit data, the outcome code including a series of outcome checks each corresponding to an anticipated error syndrome of the application of the Clifford circuit to the qubit register; emitting space-time quantum code corresponding to the Clifford circuit based on the circuit data and on the outcome code, the space-time quantum code including a series of check operators that support quantum-error correction, thereby enabling fault correction in the application of the Clifford circuit to the qubit register; emitting low-density parity-check (LDPC) space-time quantum code based on the circuit data, the outcome code, and the space-time quantum code, the LDPC space-time quantum code including connected stabilizers of the space-time quantum code up to a predetermined weight; and decoding the LDPC space-time quantum code in an LDPC decoder to correct the fault in the application of the Clifford circuit to the qubit register. One technical benefit this provides is that the problem of circuit-fault correction is reduced to the more tractable problem of error correction in quantum code. Another technical benefit is that the output of the space-time code corresponding to the Clifford circuit can be decoded using any suitable LDPC. Thus, a dedicated decoder need not be constructed to handle the output.

This disclosure is presented by way of example and with reference to the attached drawing figures. Components, process steps, and other elements that may be substantially the same in one or more of the figures are identified coordinately and described with minimal repetition. It will be noted, however, that elements identified coordinately may also differ to some degree. It will be further noted that the figures are schematic and generally not drawn to scale. Rather, the various drawing scales, aspect ratios, and numbers of components shown in the figures may be purposely distorted to make certain features or relationships easier to see.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A method to correct a fault in application of a Clifford circuit to a qubit register of a quantum computer, the method comprising:
   receiving circuit data defining the Clifford circuit;
   emitting outcome code based on the circuit data, the outcome code including a series of outcome checks each corresponding to an anticipated error syndrome of the application of the Clifford circuit to the qubit register; and
   emitting space-time quantum code corresponding to the Clifford circuit based on the circuit data and on the outcome code, the space-time quantum code including a series of check operators that support quantum-error correction, thereby enabling fault correction in the application of the Clifford circuit to the qubit register.

2. The method of claim 1 wherein the Clifford circuit includes one or more Clifford gates.

3. The method of claim 1 wherein the Clifford circuit includes one or more Pauli measurements.

4. The method of claim 1 wherein the Clifford circuit includes redundant measurements.

5. The method of claim 1 wherein the Clifford circuit is an error-syndrome extraction circuit.

6. The method of claim 1 wherein the space-time quantum code is a quantum-stabilizer code.

7. The method of claim 1 wherein each of the check operators is a stabilizer generator of the space-time quantum code, and wherein measurement of each stabilizer generator returns a result of a corresponding outcome check of the outcome code.

8. The method of claim 1 further comprising: building a lookup decoder for the space-time quantum code; and decoding the space-time quantum code via the lookup decoder to correct the fault in the application of the Clifford circuit to the qubit register.

9. The method of claim 1 further comprising:
   emitting low-density parity-check (LDPC) space-time quantum code based on the circuit data, the outcome code, and the space-time quantum code, the LDPC space-time quantum code including connected stabilizers of the space-time quantum code up to a predetermined weight; and
   decoding the LDPC space-time quantum code in an LDPC decoder to correct the fault in the application of the Clifford circuit to the qubit register.

10. The method of claim 9 wherein emitting the LDPC space-time quantum code comprises receiving the space-time quantum code in D dimensions and producing local stabilizer generators in D+1 dimensions.

11. The method of claim 9 wherein emitting the LDPC space-time quantum code comprises:
   constructing a space-time graph of the Clifford circuit; and
   constructing a set of stabilizer generators of the space-time code that are supported on local regions of the space-time graph.

12. A computer system coupled operatively to a quantum computer, the computer system comprising:
   a processor; and
   operatively coupled to the processor, computer memory holding instructions that cause the processor to correct a fault in application of a Clifford circuit to a qubit register of the quantum computer, the instructions comprising:
      instructions (A) for receiving circuit data defining the Clifford circuit;
      instructions (B) for emitting outcome code based on the circuit data, the outcome code including a series of outcome checks each corresponding to an anticipated error syndrome of the application of the Clifford circuit to the qubit register; and
      instructions (C) for emitting space-time quantum code corresponding to the Clifford circuit based on the circuit data and the outcome code, the space-time quantum code including a series of check operators that support quantum-error correction, thereby enabling fault correction in the application of the Clifford circuit to the qubit register.

13. The computer system of claim 12 wherein the Clifford circuit includes redundant measurements.

14. The computer system of claim 12 wherein the Clifford circuit is an error-syndrome extraction circuit.

15. The computer system of claim 12 wherein the space-time quantum code is a quantum-stabilizer code.

16. The computer system of claim 12 wherein each of the check operators is a stabilizer generator of the space-time quantum code, and wherein measurement of each stabilizer generator returns a result of a corresponding outcome check of the outcome code.

17. The computer system of claim 12 further comprising:
   instructions for emitting low-density parity-check (LDPC) space-time quantum code based on the circuit data, the outcome code, and the space-time quantum code, the LDPC space-time quantum code including connected stabilizers of the space-time quantum code up to a predetermined weight; and
   instructions for decoding the LDPC space-time quantum code in an LDPC decoder to correct the fault in the application of the Clifford circuit to the qubit register.

18. The computer system of claim 17 wherein emitting the LDPC space-time quantum code comprises receiving the space-time quantum code in D dimensions and producing local stabilizer generators in D+1 dimensions.

19. The computer system of claim 17 wherein emitting the LDPC space-time quantum code comprises:
   constructing a space-time graph of the Clifford circuit; and
   constructing a set of stabilizer generators of the space-time code that are supported on local regions of the space-time graph.

20. A method to correct a fault in application of a Clifford circuit to a qubit register of a quantum computer, the method comprising:
   receiving circuit data defining the Clifford circuit;
   emitting outcome code based on the circuit data, the outcome code including a series of outcome checks each corresponding to an anticipated error syndrome of the application of the Clifford circuit to the qubit register;
   emitting space-time quantum code corresponding to the Clifford circuit based on the circuit data and on the outcome code, the space-time quantum code including a series of check operators that support quantum-error correction, thereby enabling fault correction in the application of the Clifford circuit to the qubit register;
   emitting low-density parity-check (LDPC) space-time quantum code based on the circuit data, the outcome code, and the space-time quantum code, the LDPC space-time quantum code including connected stabilizers of the space-time quantum code up to a predetermined weight; and decoding the LDPC space-time quantum code in an LDPC decoder to correct the fault in the application of the Clifford circuit to the qubit register.

\* \* \* \* \*